(12) United States Patent
Okamoto

(10) Patent No.: US 10,175,313 B2
(45) Date of Patent: Jan. 8, 2019

(54) MAGNETIC RESONANCE IMAGING APPARATUS AND RF COIL DEVICE

(71) Applicant: TOSHIBA MEDICAL SYSTEMS CORPORATION, Otawara-Shi, Tochigi-Ken (JP)

(72) Inventor: Kazuya Okamoto, Saitama (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 681 days.

(21) Appl. No.: 14/246,745

(22) Filed: Apr. 7, 2014

(65) Prior Publication Data

US 2014/0218035 A1   Aug. 7, 2014

Related U.S. Application Data

(63) Continuation of application No. PCT/JP2014/050904, filed on Jan. 20, 2014.

(30) Foreign Application Priority Data

Jan. 23, 2013   (JP) ................................ 2013-010298

(51) Int. Cl.
   *G01R 33/36* (2006.01)
(52) U.S. Cl.
   CPC ...... *G01R 33/3692* (2013.01); *G01R 33/3635* (2013.01); *G01R 33/3678* (2013.01)

(58) Field of Classification Search
   CPC .............. G01R 33/3692; G01R 33/283; G01R 33/3614; G01R 33/3642; G01R 33/422;
   (Continued)

(56) References Cited

U.S. PATENT DOCUMENTS

2007/0176600 A1 * 8/2007 Laubacher ........... G01R 33/441
                                                         324/300
2008/0061785 A1   5/2008 Soutome et al.
(Continued)

FOREIGN PATENT DOCUMENTS

CN   102066967 A   5/2011
CN   102540118 A   7/2012
(Continued)

OTHER PUBLICATIONS

JP Office Action dated Aug. 9, 2016 in JP 2013-010298.
(Continued)

*Primary Examiner* — Ruifeng Pu
(74) *Attorney, Agent, or Firm* — Nixon & Vanderhye P.C.

(57) ABSTRACT

According to one embodiment, an MRI apparatus includes a power transmitting unit, a signal receiving unit and an image reconstruction unit (62). The power transmitting unit wirelessly transmits electric power to an RF coil device by magnetically coupled resonant type wireless power transfer. The signal receiving unit wirelessly receives a digitized nuclear magnetic resonance signal wirelessly transmitted from the RF coil device. The image reconstruction unit obtains a nuclear magnetic resonance signal received by the signal receiving unit, and reconstructs image data of an object on the basis of the nuclear magnetic resonance signal.

7 Claims, 17 Drawing Sheets

(58) Field of Classification Search
CPC .......... G01R 33/34046; G01R 33/3415; G01R 33/3621; G01R 33/3635; G01R 33/678
See application file for complete search history.

(56) References Cited

U.S. PATENT DOCUMENTS

| | | | |
|---|---|---|---|
| 2009/0160442 A1 | 6/2009 | Mazurkewitz et al. | |
| 2009/0237079 A1 | 9/2009 | Van Helvoort et al. | |
| 2009/0302846 A1* | 12/2009 | Wong | G01R 33/34023 324/322 |
| 2010/0308826 A1 | 12/2010 | Saes et al. | |
| 2011/0084694 A1 | 4/2011 | Waffenschmidt et al. | |
| 2012/0299593 A1* | 11/2012 | Biber | G01R 33/3415 324/322 |
| 2012/0313645 A1* | 12/2012 | Biber | G01R 33/3692 324/322 |
| 2013/0200894 A1* | 8/2013 | Albsmeier | A61B 5/055 324/318 |
| 2013/0241308 A1* | 9/2013 | Bilbrey | G01R 33/3692 307/104 |
| 2014/0218034 A1* | 8/2014 | Ishii | G01R 33/3692 324/322 |
| 2014/0218035 A1* | 8/2014 | Okamoto | G01R 33/3692 324/322 |
| 2014/0361769 A1* | 12/2014 | Hardie | G01R 33/34 324/307 |
| 2016/0041250 A1* | 2/2016 | Kimmlingen | G01R 33/583 600/410 |
| 2016/0054399 A1* | 2/2016 | Mori | A61B 5/055 324/318 |
| 2016/0077175 A1* | 3/2016 | Mori | G01R 33/3692 324/321 |
| 2016/0109541 A1* | 4/2016 | Hayakawa | G01R 33/3415 324/322 |
| 2016/0154074 A1* | 6/2016 | Okamoto | G01R 33/5659 324/322 |
| 2016/0161585 A1* | 6/2016 | Wadate | G01R 33/3415 600/413 |
| 2016/0169991 A1* | 6/2016 | Kato | G01R 33/3692 324/322 |

FOREIGN PATENT DOCUMENTS

| | | |
|---|---|---|
| JP | 5-261083 | 10/1993 |
| JP | 2714044 B | 10/1997 |
| JP | 2008-523943 | 7/2008 |
| JP | 2009-72580 | 4/2009 |
| JP | 2009-532181 A | 9/2009 |
| JP | 2010-29644 | 2/2010 |
| JP | 2011-507588 | 3/2011 |
| JP | 2011-524773 | 9/2011 |
| JP | 2012-39849 | 2/2012 |

OTHER PUBLICATIONS

English Translation of International Preliminary Report on Patentability dated Jul. 28, 2015 for Application No. PCT/JP2014/050904.
Japanese office action dated Mar. 14, 2017 in Patent Application No. JP 2013-010298.
Chinese office action dated May 3, 2017, in Patent Application No. CN 201480005800.0.
Chinese office action dated Jan. 15, 2018; in Patent Application No. CN 201480005800.0.
Chinese office action dated Jul. 10, 2018, in Patent Application No. CN 201480005800.0.

* cited by examiner

MAGNETIC RESONANCE IMAGING APPARATUS AND RF COIL DEVICE

CROSS-REFERENCE TO RELATED APPLICATIONS

This application is a Continuation application of No. PCT/JP2014/50904, filed on Jan. 20, 2014, and the PCT application is based upon and claims the benefit of priority from Japanese Patent Application No. 2013-10298, filed on Jan. 23, 2013, the entire contents of which are incorporated herein by reference.

FIELD OF THE INVENTION

Embodiments described herein relate generally to a magnetic resonance imaging apparatus and an RF coil device.

DESCRIPTION OF THE RELATED ART

MRI is an imaging method which magnetically excites nuclear spin of an object (a patient) placed in a static magnetic field with an RF pulse having the Larmor frequency and reconstructs an image on the basis of MR signals generated due to the excitation. The aforementioned MRI means magnetic resonance imaging, the RF pulse means a radio frequency pulse, and the MR signal means a nuclear magnetic resonance signal.

Here, an RF (Radio Frequency) coil device is a device which transmits an RF pulse to nuclear spin inside an object by, for example, supplying a coil with an RF pulse electric current and detects generated MR signals.

Some of RF coil devices are built-in types included in an MRI apparatus and other RF coil devices are recognized by a control unit of the MRI apparatus by being connected to a connection port of the MRI apparatus such as local RF coil devices, for example.

In MRI, multi-channel structure is promoted in acquisition system of MR signals. The above "channel" means each pathway of a plurality of MR signals outputted from each coil element and inputted to an RF receiver of an MRI apparatus. Although the number of the channels is determined to be equal to or smaller than the input reception number of the RF receiver, a large number of RF coil devices can be connected to an MRI apparatus.

If the number of cables between an RF coil device and a control side (the above RF receiver side) of an MRI apparatus increases due to promotion of the aforementioned multichannel structure, it is inconvenient because hard-wiring becomes complicated.

Therefore, it is desired to unwire transmission and reception of signals between an RF coil device and an MRI apparatus. However, radio communication by an analogue signal has not been achieved, because there are various restrictions such as degradation of dynamic range.

More specifically, in order to suppress influence on receiving sensitivity to weak MR signals emitted from an object, it is impossible in an MRI apparatus to enlarge the output of electromagnetic waves used for radio communication between an RF coil device and an MRI apparatus. If it is impossible to enlarge the radio output power, dynamic range degrades due to signal loss caused when transmitted signals travel space. Then, in Japanese Patent Application Laid-open (KOKAI) Publication No. 2010-29664, a digital radio communication method in which MR signals are digitized and then transmitted wirelessly is proposed.

The problem of the restriction of the dynamic range can be solved by wirelessly transmitting MR signals after digitalization.

However, how to reserve electric power of the RF coil device side has not been sufficiently considered in digital radio communication of MR signals. For example, though a built-in rechargeable battery may be included inside an RF coil device, currently commercially-supplied rechargeable batteries are not sufficient in terms of charging capacity as compared with power consumption of an RF coil device in MRI. Thus, if many pulse sequences are performed, a situation where it has no choice but to exchange the rechargeable battery before performing the next pulse sequence is supposed.

Therefore, a novel technology to save electric power of an RF coil device satisfactorily and effectively in structure of wirelessly transmitting MR signals detected by the RF coil device to a control side of an MRI apparatus has been desired.

DETAILED DESCRIPTION

Figure 1:
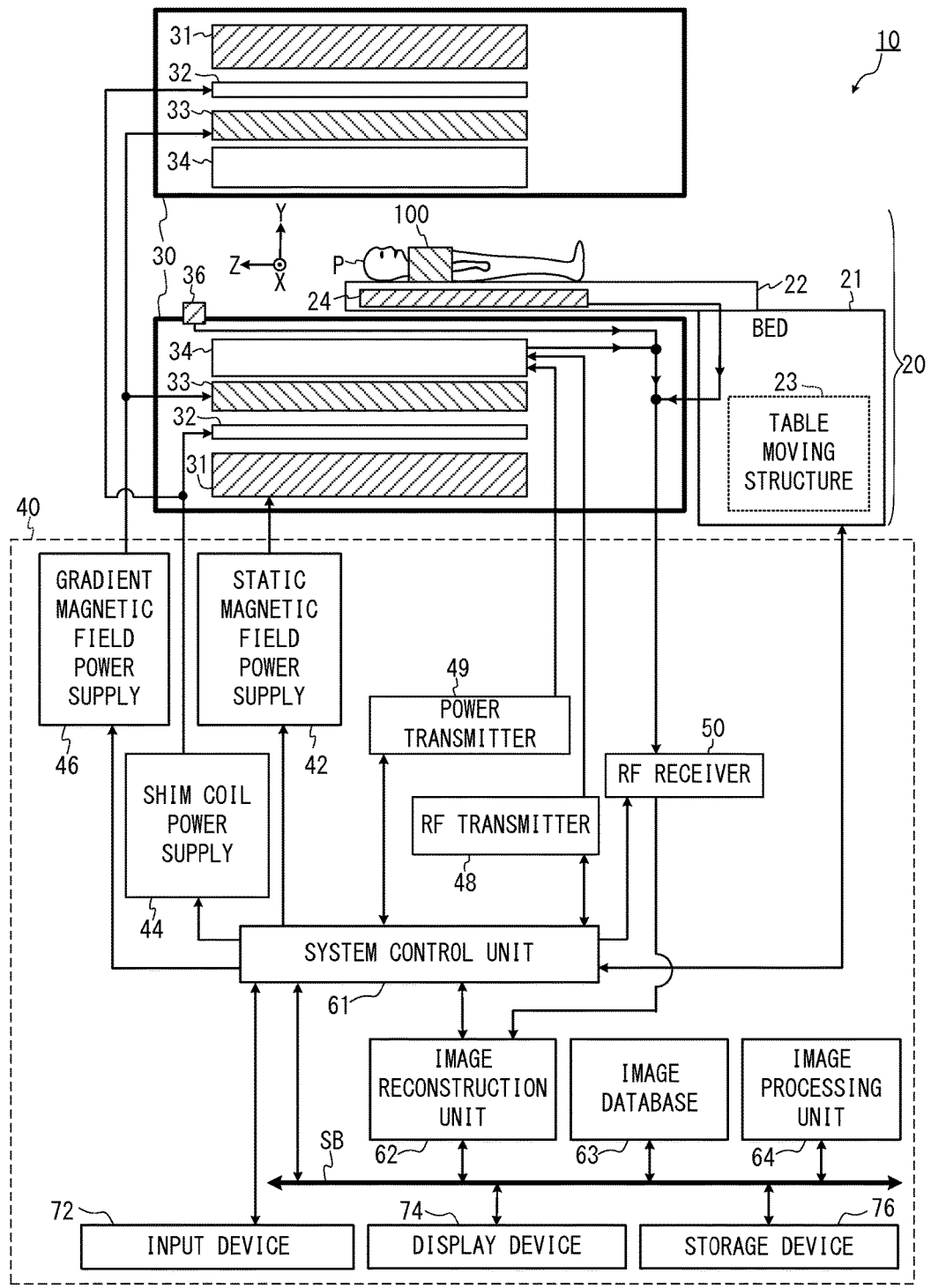
FIG. 1 is a block diagram showing the general structure of the MRI apparatus of the first embodiment.

As methods of transmitting electric power to a wearable type RF coil device, (1) electromagnetic inductive wireless power transfer and capacitive coupling wireless power transfer which are capable of wireless transmission within a short-distance, (2) magnetically coupled resonant type wireless power transfer that is capable of wireless transmission between mutually slightly distant positions and (3) line-coupled wireless power transfer that wirelessly transmits electric power via line, are possible.

However, considering the convenience of a user in the structure of wirelessly transmitting MR signals from the RF coil device side to the control side of the MRI apparatus, it is desirable to be able to wirelessly transmit electric power to an RF coil device remotely located to some extent. If it is not achieved, the power transmission side and the power receiving side are closely fixed to each other by any suitable means, and this restricts the arrangement of wearable type RF coil devices.

Considering the above, it is considered that the magnetically coupled resonant type wireless power transfer (method) mentioned in the above (2) is preferable. However, in the conventional technology, there is not an idea of wirelessly transmitting electric power to an RF coil device by the magnetically coupled resonant type wireless power transfer. Then, the inventor has worked out a novel technology of wirelessly transmitting electric power satisfactorily and effectively to an RF coil device remotely located to some extent by the magnetically coupled resonant type wireless power transfer.

In the magnetically coupled resonant type wireless power transfer of the present embodiments, the resonance frequencies of the respective antenna circuits of the power transmission side and the power receiving side are adjusted so as to become equal. Then, electromagnetic waves of the resonance frequency are generated by supplying a great current to the antenna circuit of the power transmission side, and thereby the antenna circuit of the power receiving side resonates due to the electromagnetic waves.

By the electric current flowing the antenna circuit of the power receiving side in the above manner, a charge/discharge element of the power receiving side can be charged. The charge/discharge element herein refers to a circuit element that can be repeatedly charged and discharged, such as a capacitor, a rechargeable battery and so on. Although examples of a rechargeable battery BAT will be explained in the following embodiments, other charge/discharge elements such as an electric double layer capacitor may be alternatively used.

Hereinafter, examples of aspects which embodiments of the present invention can take will be explained per aspect.

(1) According to one embodiment, an MRI apparatus obtains an MR signal from an RF coil device that detects the MR signal emitted from an object, and this MRI apparatus includes a power transmitting unit, a signal receiving unit and an image reconstruction unit.

The power transmitting unit wirelessly transmits electric power to a power receiving unit of the RF coil device by the magnetically coupled resonant type wireless power transfer.

The signal receiving unit wirelessly receives a digitized MR signal wirelessly transmitted from the RF coil device.

The image reconstruction unit obtains the digitized MR signal received by the signal receiving unit, and reconstructs image data of the object on the basis of the digitized MR signal.

(2) According to another embodiment, an RF coil device includes a coil element, a power receiving unit and a signal transmitting unit.

The coil element detects an MR signal emitted from an object.

The power receiving unit receives electric power wirelessly transmitted by the magnetically coupled resonant type wireless power transfer.

The signal transmitting unit digitizes the MR signal detected by the coil element and wirelessly transmits the digitized MR signal to an MRI apparatus, by consuming the electric power received by the power receiving unit.

In the following, embodiments of the RF coil devices, the MRI apparatuses and the MRI methods to which the above new technology is applied will be described with reference to the accompanying drawings. Note that the same reference numbers are given for identical components in each figure, and overlapping explanation is abbreviated.

The First Embodiment

The difference between the first embodiment and the second to the fifth embodiments is as follows.

That is, in the first embodiment, a whole body coil WB1 combines both functions of transmitting electric power and transmitting RF pulses and each coil element inside an RF coil device 100 combines both functions of detecting MR signals and receiving electric power.

On the other hand, the whole body coil of the second embodiment, the third embodiment and the fifth embodiment does not have a function of transmitting electric power. In addition, in the fourth embodiment, a power receiving coil is disposed inside the RF coil device as a separate component from the coil elements.

Thus, the whole body coil WB1 (see FIG. 2) of the first embodiment performs transmission of the RF pulses to an imaging region and wireless transmission of electric power to an wearable type RF coil device.

Although the function of detecting MR signals from an object is not indispensable for the whole body coil WB1, the whole body coil WB1 has the function of detecting MR signals as an example in the present embodiment.

Therefore, the whole body coil WB1 has structure of double resonance type (doubly-tuned type), transmits the RF pulses by resonating at the Larmor frequency, and wirelessly transmits electric power to the RF coil device by resonating at a predetermined frequency which is lower than the Larmor frequency. In addition, the whole body coil WB1 induces (detects) MR signals from the object by resonating at the Larmor frequency.

Similarly, each coil element inside the RF coil device has the structure of the double resonance type.

In the following, embodiments will be explained in order, starting from the overall structure of the MRI apparatus.

FIG. 1 is a block diagram showing the general structure of the MRI apparatus 10 according to the first embodiment.

For the sake of avoiding complication, FIG. 1 does not show all the components of the MRI apparatus 10, and other components omitted in FIG. 1 such as a high pass filter HPF1 will be explained with FIG. 2 to FIG. 7.

As an example here, the components of the MRI apparatus 10 will be explained by classifying them into three groups which are a bed unit 20, a gantry 30 and a control device 40.

Firstly, the bed unit 20 includes a bed 21, a table 22, and a table moving structure 23 disposed inside the bed 21. An object P is loaded on the top surface of the table 22. In addition, a reception RF coil device 24 is disposed inside the table 22.

The bed 21 supports the table 22 in such a manner that the table 22 can move in the horizontal direction (i.e. the Z axis direction of the apparatus coordinate system).

The table moving structure 23 adjusts the position of the table 22 in the vertical direction by adjusting the height of the bed 21, when the table 22 is located outside the gantry 30.

In addition, the table moving structure 23 inserts the table 22 into inside of the gantry 30 by moving the table 22 in the horizontal direction and moves the table 22 to outside of the gantry 30 after completion of imaging.

As an example here, a wearable type RF coil device 100 that detects MR signals from the chest part is loaded on the object P. The RF coil device 100 receives wirelessly transmitted electric power by the magnetically coupled resonant type wireless power transfer, and operates by consuming this electric power. The RF coil device 100 digitizes the MR signals detected from the object P, and wirelessly transmits the digitized MR signals to the control side (the later-described radio communication device 36) of the MRI apparatus 10.

In the present embodiment, various RF coil devices of digital radio communication type such as a pelvic part RF coil device and a lower limb RF coil device can be used in addition to the above RF coil device 100 for the chest part. Although each of these RF coil devices is assumed to be a part the MRI apparatus 10 in the present embodiment and the later-described second to the fifth embodiments, they may be interpreted as components independent from the MRI apparatus 10.

Secondly, the gantry 30 is shaped in the form of a cylinder, for example, and is installed in an imaging room. The gantry 30 includes a static magnetic field magnet 31, a shim coil unit 32, a gradient magnetic field coil unit 33 and an RF coil unit 34.

The static magnetic field magnet 31 is, for example, a superconductivity coil and shaped in the form of a cylinder. The static magnetic field magnet 31 forms a static magnetic field in an imaging space by using electric currents supplied from the later-described static magnetic field power supply 42. The aforementioned "imaging space" means, for example, a space in the gantry 30 in which the object P is placed and to which the static magnetic field is applied. Note that the static magnetic field magnet 31 may include a permanent magnet which makes the static magnetic field power supply 42 unnecessary.

The shim coil unit 32 is, for example, shaped in the form of a cylinder and arranged inside the static magnetic field magnet 31 so as to become coaxial to the static magnetic field magnet 31. The shim coil unit 32 forms an offset magnetic field that uniforms the static magnetic field by using electric currents supplied from the later described shim coil power supply 44 of the control device 40.

The gradient magnetic field coil unit 33 is, for example, shaped in the form of a cylinder and arranged inside the shim coil unit 32. The gradient magnetic field coil unit 33 includes an X axis gradient magnetic field coil $33x$, a Y axis gradient magnetic field coil $33y$ and a Z axis gradient magnetic field coil $33z$ (not shown).

In this specification, the X axis, the Y axis and the Z axis are assumed to be those of the apparatus coordinate system unless otherwise specifically noted.

As an example here, the apparatus coordinate system, whose X axis, Y axis and Z axis are perpendicular to each other, is defined as follows.

Firstly, the Y axis direction is defined as the vertical direction, and the table 22 is disposed in such a position that the direction of the normal line of its top surface accords with the Y axis direction. The horizontal moving direction of the table 22 is defined as the Z axis direction, and the gantry 30 is installed in such a manner that its axis direction accords with the Z axis direction. The X axis direction is the direction perpendicular to these Y axis direction and Z axis direction, and is the width direction of the table 22 in the example of FIG. 1.

The (unillustrated) X axis gradient magnetic field coil forms a gradient magnetic field Gx in the X axis direction in an imaging region in accordance with an electric current supplied from the later-described gradient magnetic field power supply 46.

Similarly, the (unillustrated) Y axis gradient magnetic field coil forms a gradient magnetic field Gy in the Y axis direction in the imaging region in accordance with an electric current supplied from the gradient magnetic field power supply 46.

Similarly, the (unillustrated) Z axis gradient magnetic field coil forms a gradient magnetic field Gz in the Z axis direction in the imaging region in accordance with an electric current supplied from the gradient magnetic field power supply 46.

Thereby, directions of a gradient magnetic field Gss in a slice selection direction, a gradient magnetic field Gpe in a phase encoding direction and a gradient magnetic field Gro in a readout (frequency encoding) direction can be arbitrarily selected as logical axes, by combining the gradient magnetic fields Gx, Gy and Gz in the X axis, the Y axis and the Z axis directions as three physical axes of the apparatus coordinate system.

The above "imaging region" means, for example, at least a part of an acquisition range of MR signals used to generate one image or one set of images, which becomes an image. The imaging region is three-dimensionally defined as a part of the imaging space in terms of range and position by the apparatus coordinate system, for example. For example, when MR signals are acquired in a range wider than a region made into an image in order to prevent wraparound artifact, the imaging region is a part of the acquisition range of MR signals. On the other hand, in some cases, the entire acquisition range of MR signals becomes an image, and the imaging region accords with the acquisition range of MR signals. In addition, the above "one set of images" means, for example, a plurality of images when MR signals of the plurality of images are acquired in a lump in one pulse sequence such as multi-slice imaging.

The RF coil unit 34 is, for example, shaped in the form of a cylinder and arranged inside the gradient magnetic field coil unit 33. The RF coil unit 34 includes the aforementioned whole body coil WB1. Details of the whole body coil WB1 will be described later with FIG. 2. In addition, the RF coil unit 34 may further include a power transmitting coil that exclusively performs transmission of electric power.

The radio communication device 36 receives digitized MR signals wirelessly transmitted from the RF coil device 100, and inputs the received MR signals into the RF receiver 50.

Thirdly, the control device 40 includes the static magnetic field power supply 42, the shim coil power supply 44, the gradient magnetic field power supply 46, an RF transmitter 48, a power transmitter 49, an RF receiver 50, a system control unit 61, a system bus SB, an image reconstruction unit 62, an image database 63, an image processing unit 64, an input device 72, a display device 74 and the storage device 76.

The gradient magnetic field power supply 46 supplies the respective electric currents for forming the gradient magnetic field Gx, the gradient magnetic field Gy and the gradient magnetic field Gz to the X axis gradient magnetic field coil, the Y axis gradient magnetic field coil and the Z axis gradient magnetic field coil, respectively.

The power transmitter 49 transmits alternating-current power of a predetermined frequency for wireless transmission to the whole body coil WB1. As to details of this operation, it will be later explained with FIG. 2 and FIG. 3.

The RF transmitter 48 generates RF pulse electric currents of the Larmor frequency for causing nuclear magnetic resonance in accordance with control information inputted from the system control unit 61, and transmits the generated RF pulse electric currents to the RF coil unit 34. The RF pulses in accordance with these RF pulse electric currents are transmitted from the RF coil unit 34 to the object P.

The whole body coil WB1, the reception RF coil 24 and the RF coil device 100 detect MR signals generated due to excited nuclear spin inside the object P by the RF pulses and the detected MR signals are inputted to the RF receiver 50 by wire.

The RF receiver 50 generates raw data of MR signals by performing predetermined signal processing on the MR signals inputted from the whole body coil WB1, the reception RF coil 24 or the RF coil device 100, then performing A/D (analogue to digital) conversion on them, and then performing processing such as filtering. The raw data are digitized into complex number data of digitized MR signals.

Because the signals from the radio communication device 36 have been already digitized by A/D conversion, only necessary data processing is performed. The RF receiver 50 inputs the raw data of the MR signals into the image reconstruction unit 62.

The system control unit 61 performs system control of the MRI apparatus 10 in setting of imaging conditions of a main scan, an imaging operation and image display after imaging through interconnection such as the system bus SB.

The aforementioned term "imaging condition" refers to under what condition RF pulses or the like are transmitted in what type of pulse sequence, or under what condition MR signals are acquired from the object P, for example.

As parameters of the imaging conditions, for example, there are the imaging region as positional information in the imaging space, the number of slices, an imaging part and the type of the pulse sequence such as spin echo and parallel imaging. The above "imaging part" means a region of the object P to be imaged, such as a chest and an abdomen.

The aforementioned "main scan" is a scan for imaging an intended diagnosis image such as a T1 weighted image, and it does not include a scan for acquiring MR signals for a scout image or a calibration scan.

A scan is an operation of acquiring MR signals, and it does not include image reconstruction processing.

The calibration scan is a scan for determining unconfirmed elements of imaging conditions, conditions and data used for image reconstruction processing and correction processing after the image reconstruction, and the calibration is performed separately from the main scan.

As a calibration scan, there are a sequence of calculating the center frequency of the RF pulses of the main scan and so on. Out of calibration scans, a prescan is a scan performed before the main scan.

In addition, the system control unit 61 makes the display device 74 display screen information for setting imaging conditions, sets the imaging conditions on the basis of command information from the input device 72. In addition, the system control unit 61 makes the display device 74 display images indicated by the generated display image data after completion of imaging.

The input device 72 provides a user with a function to set the imaging conditions and image processing conditions.

The image reconstruction unit 62 arranges and stores the raw data of MR signals inputted from the RF receiver 50 as k-space data, in accordance with the phase encode step number and the frequency encode step number. The above k-space means a frequency space. The image reconstruction unit 62 generates image data of the object P by performing image reconstruction processing including such as two-dimensional Fourier transformation and so on. The image reconstruction unit 62 stores the generated image data in the image database 63.

The image processing unit 64 takes in the image data from the image database 63, performs predetermined image processing on them, and stores the image data after the image processing in the storage device 76 as display image data.

The storage device 76 stores the display image data after adding accompanying information such as the imaging conditions used for generating the display image data and information of the object P (patient information) to the display image data.

Note that, though the components of the MRI apparatus 10 are classified into three groups (the gantry 30, the bed unit 20 and the control device 40), this is only an example of interpretation.

For example, the table moving structure 23 may be interpreted as a part of the control device 40.

Alternatively, the RF receiver 50 may be included not outside the gantry 30 but inside the gantry 30. In this case, for example, an electronic circuit board that is equivalent to the RF receiver 50 may be disposed in the gantry 30. Then, the MR signals, which are electrical signals converted from the electromagnetic waves by the reception RF coil 24 and so on, may be amplified by a pre-amplifier in the electronic circuit board, then the amplified signals may be outputted to the outside of the gantry 30 as digital signals and inputted to the image reconstruction unit 62. In outputting the signals to the outside of the gantry 30, for example, an optical communication cable is preferably used to transmit the signals in the form of optical digital signals. This is because the effect of external noise is reduced.

Figure 2:
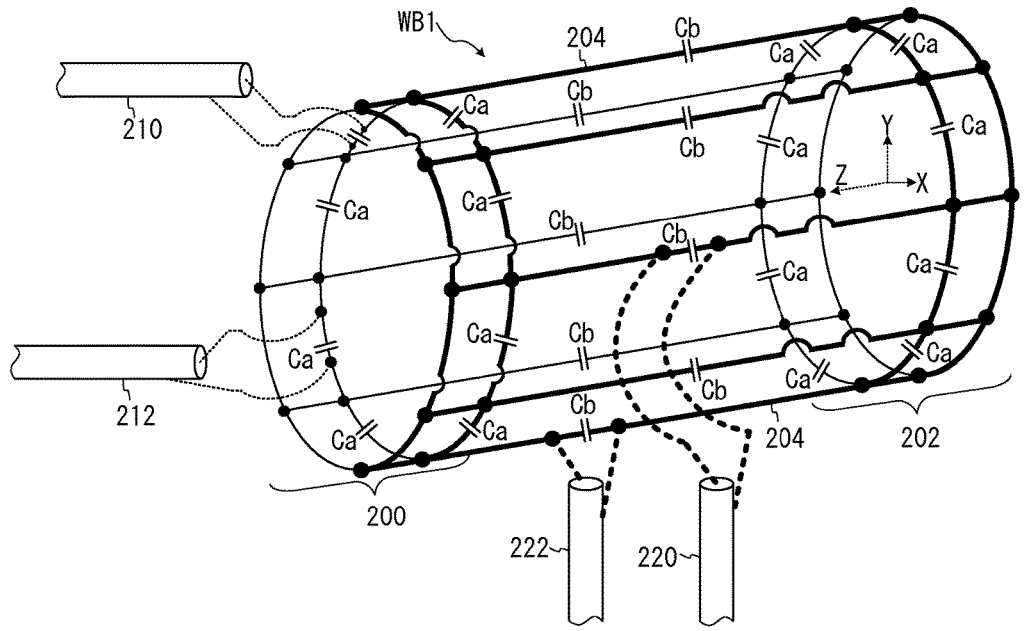
FIG. 2 is a schematic oblique perspective figure showing an example of the structure of the whole body coil of the MRI apparatus of the first embodiment.

FIG. 2 is a schematic oblique perspective figure showing an example of the structure of the whole body coil WB1 of the MRI apparatus 10 of the first embodiment.

Note that, the conducting wires of the circuit of the whole body coil WB1 located on the plus side (near side) in the X axis direction are indicated by bold lines and the conducting wires located on the minus side (remote side) in the X axis direction are indicated by fine lines in order to make the respective wires distinguishable.

In addition, as to each of the points where one conducting wire intersects with another conducting wire, electrically connected points are indicated by filled circle and non-connected points are distinguished from the electrically connected points by semicircularly indicating either no connection between the conducting wires.

The whole body coil WB1 includes the first loop conductor 200, the second loop conductor 202, eight connecting conductors (rungs) 204, sixteen parallel resonance capacitors Ca and eight series resonance capacitors Cb.

In FIG. 2, the first loop conductor 200 corresponds to the two rings on the left side in parallel with an X-Y plane, and the second loop conductor 202 corresponds to the two rings on the right side in parallel with an X-Y plane.

The connecting conductors 204 correspond to eight straight lines extending along the Z axis direction as an example in FIG. 2, five of them are indicated by bold lines and three of them are indicated by fine lines. Each of the eight connecting conductors 204 is connected to the first loop conductor 200 on its one end and is connected to the second loop conductor 202 on its other end. That is, the whole body coil WB1 is of a bird cage type by the first loop conductor 200, the second loop conductor 202 and the eight connecting conductors 204.

In the middle of each of the connecting conductors 204 (for example, in the center), one series resonance capacitor Cb is inserted in series.

In the first loop conductor 200, the ring on the side of the second loop conductor 202 includes eight connection nodes connecting itself to the eight connecting conductors 204, and eight parallel resonance capacitors Ca are connected (inserted) between two of the eight connection nodes one by one, so as to be in parallel with the rings of the first loop conductor 200.

Similarly, in the second loop conductor 202, the ring on the side of the first loop conductor 200 includes eight connection nodes connecting itself to the eight connecting conductors 204, and eight parallel resonance capacitors Ca are connected (inserted) between two of the eight connection nodes one by one, so as to be in parallel with the rings of the second loop conductor 202.

That is, if the wires between connection nodes of the connecting conductors 204 and the first loop conductor 200 or the second loop conductor 202 are interpreted as inductance components, an LC circuit is partially established between the wires and the parallel resonance capacitors Ca.

Thus, the whole body coil WB1 of the first embodiment has the structure obtained by changing the element number (of the ladder type delay circuit) of the double resonance RF coil in FIG. 1 of Japanese Patent No. 2714044 from six to eight, in terms of circuit. The number of elements herein is equal to the number of the connecting conductors 204.

Therefore, because the whole body coil WB1 resonates at two different frequencies, the higher resonance frequency is defined as the first resonance frequency f1 and the lower resonance frequency is defined as the second resonance frequency f2.

The circuit constants of the whole body coil WB1 are set in such a manner that the first resonance frequency f1 becomes the Larmor frequency and the second resonance frequency f2 becomes the frequency for transmitting electric power. In the present specification, it is assumed that the Larmor frequency is the same as the magnetic resonance frequency.

The above circuit constants are (1) the capacitance value of the parallel resonance capacitor Ca, (2) the capacitance value of the series resonance capacitor Cb, (3) the inductance between the connection nodes in the first loop conductor 200 (each connection node connects the ring to one of the connecting conductors 204), (4) the inductance between the connection nodes in the second loop conductor 202 (each connection node connects the ring to one of the connecting conductors 204), and so on.

As to the second resonance frequency f2 for transmitting electric power, though the frequency bands restricted by the regulations of the country where the MRI apparatus 10 is installed are avoided, 6 MHz band and 13 MHz band can be used in Japan at the filing time of this application, for example.

However, in the case of wirelessly transmitting electric power to an RF coil device continuously regardless of a transmission period of an RF pulse and a detection period of MR signals (see later-described FIG. 8), it is safer to set the second resonance frequency f2 avoiding frequencies obtained by dividing the Larmor frequency by a natural number.

In addition, because the equations for obtaining the first resonance frequency f1 and the second resonance frequency f2 are written in page three of the aforementioned Japanese Patent No. 2714044, detailed explanation is omitted here.

Because the whole body coil WB1 is a bird cage type of eight elements, as an example in FIG. 2, it is supplied with electric power by a QD (quadrature phase) system from the respective connection nodes whose angles are mutually different by 90 degrees. This is so that the transmitted energy effectively contributes to rotation (excitation) of nuclear spin in consideration of the generation direction of magnetic fields.

More specifically, the high frequency transmitting and receiving cables 210 and 212 are respectively connected to positions having mutually different angles by 90 degrees in the first loop conductor 200. That is, between the one parallel resonance capacitor Ca whose both ends are connected to the high frequency transmitting and receiving cable 210 and the other parallel resonance capacitor Ca whose both ends are connected to the high frequency transmitting and receiving cable 212, another parallel resonance capacitor Ca is sandwiched.

In addition, the power transmission cable 220 is connected to both ends of the series resonance capacitor Cb of one connecting conductor 204, and the power transmission cable 222 is connected to both ends of the series resonance capacitor Cb of another connecting conductor 204.

If the whole body coil WB1 is observed from a cross-section of an X-Y plane, it is interpreted as the QD system because the number of the connecting conductors 204 is eight and one connecting conductor 204 is interposed between the connecting conductor 204 connected to the power transmission cable 220 and the connecting conductor 204 connected to the power transmission cable 222.

Note that, the connection wires of these high frequency transmitting and receiving cables 210 and 212 and the power transmission cables 220 and 222 to the whole body coil WB1 are respectively indicated by dashed lines in FIG. 2 in order to distinguish them from the conducting wires of the whole body coil WB1.

Figure 3:
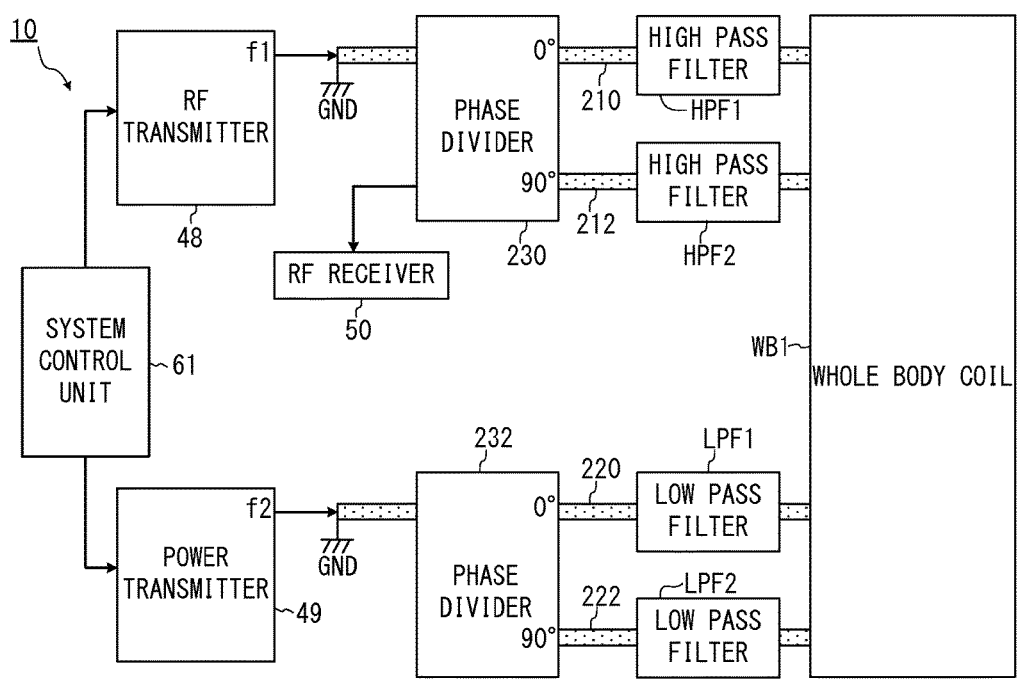
FIG. 3 is a schematic block diagram showing the structure relevant to the transmission system of RF pulses and the transmission system of electric power of the MRI apparatus of the first embodiment.

FIG. 3 is a schematic block diagram showing the structure relevant to the transmission system of the RF pulses and the transmission system of the electric power of the MRI apparatus 10 of the first embodiment. GND in FIG. 3 indicates a ground line.

As shown in FIG. 3, the MRI apparatus 10 further includes phase dividers 230, 232, high pass filters HPF1, HPF2, and low pass filters LPF1, LPF2. The high pass filters HPF1 and HPF2 are respectively inserted in the high frequency transmitting and receiving cables 210 and 212 in series. The low pass filters LPF1 and LPF2 are respectively inserted in the power transmission cables 220 and 222 in series.

The RF transmitter 48 sets the first resonance frequency f1 to the Larmor frequency inputted from the system control unit 61, and supply high-frequency electric power of the first resonance frequency f1 to the phase divider 230.

The phase divider 230 amplifies the inputted high-frequency electric power, and two-divides the amplified electric power into RF pulses (high-frequency pulses) whose phases are mutually different by 90 degrees.

The phase divider 230 supplies one of the two-divided RF pulses whose phase is 0 degree to both ends of one parallel resonance capacitor Ca of the whole body coil WB1, via the high frequency transmitting and receiving cable 210. In addition, the phase divider 230 supplies the other of the two-divided RF pulses whose phase is 90 degrees to both ends of another parallel resonance capacitor Ca of the whole body coil WB1, via the high frequency transmitting and receiving cable 212.

Thereby, because the whole body coil WB1 resonates at the first resonance frequency f1, the RF pulses are transmitted from the whole body coil WB1 to an imaging region by the QD system.

Note that, the high pass filters HPF1 and HPF2 prevent the second resonance frequency f2 which is lower than the first resonance frequency f1 from invading into the phase divider 230 side via the whole body coil WB1.

On the other hand, the power transmitter 49 sets the second resonance frequency f2 to the frequency for electric power transmission inputted from the system control unit 61, and supplies alternating-current power of the second resonance frequency f2 to the phase divider 232. The phase divider 232 amplifies the inputted alternating-current power, and two-divides the amplified alternating-current power in such a manner that one of the two-divided alternating-current powers has a phase being different by 90 degrees from the other of the two-divided alternating-current powers.

The phase divider 232 supplies one of the two-divided alternating-current powers whose phase is 0 degree to both ends of one series resonance capacitor Cb of the whole body coil WB1, via the power transmission cable 220.

In addition, the phase divider 232 supplies the other of the two-divided alternating-current powers whose phase is 90 degrees to both ends of another series resonance capacitor Cb of the whole body coil WB1, via the power transmission cable 222.

Thereby, because the whole body coil WB1 resonates at the second resonance frequency f2, electromagnetic waves of the second resonance frequency f2 are transmitted from the whole body coil WB1 by the QD system. That is, electric power is wirelessly transmitted to the RF coil device 100.

Note that, the low pass filters LPF1 and LPF2 prevent the first resonance frequency f1 from invading into the phase divider 232 side via the whole body coil WB1.

In addition, it is not necessary to compose the power transmission side under the QD system, and the power transmission cable 222 in FIG. 2 and the phase divider 232 in FIG. 3 may be omitted.

Figure 4:
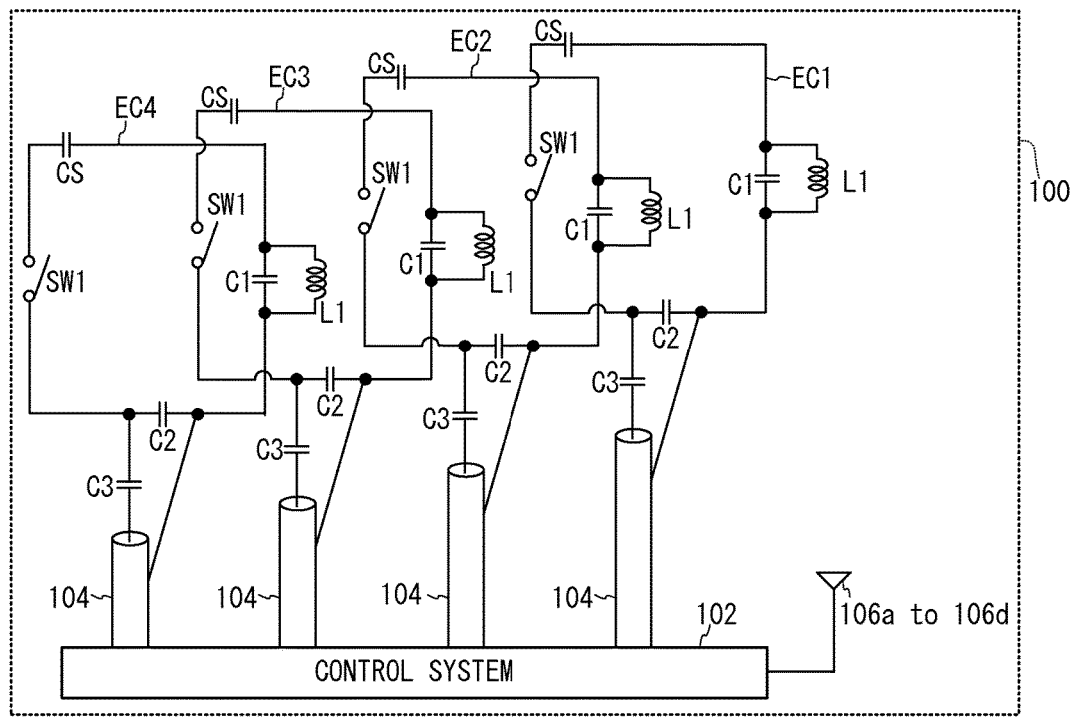
FIG. 4 is a schematic equivalent circuit diagram showing an example of the structure of the coil elements of the RF coil device of the first embodiment.

FIG. 4 is a schematic equivalent circuit diagram showing an example of the structure of the coil elements of the RF coil device 100 of the first embodiment. Although only four coil elements EC1 to EC4 are shown in FIG. 4 for the sake of avoiding complication, the number of the coil elements may be three, less than three, five or more than five.

As shown in FIG. 4, each of the coil elements EC1 to EC4 includes a switch SW1, capacitors C1, C2, CS and a coil L1. Each of the coil elements EC1 to EC4 is a double resonance type.

That is, in each of the coil elements EC1 to EC4, the respective capacitance values of the capacitors C1, C2 and CS and the inductance value of the coil L1 are matched, in such a manner that the first resonance frequency f1 becomes the Larmor frequency and the second resonance frequency f2 becomes the transmission frequency of the alternating-current power. This point will be further explained with the next FIG. 5. In addition, as to ON/OFF switching of the switch SW1, it will be explained with the later-described FIG. 7.

In addition, the RF coil device 100 includes the same number of coaxial cables 104 as the coil elements so as to respectively correspond to the coil elements EC1 to EC4. One end of each of the coaxial cables 104 is connected to both ends of the capacitor C2 of each of the coil elements EC1 to EC4. The other end of each of the coaxial cables 104 is connected to the control system 102 of the RF coil device 100. The capacitor C3 is inserted in one end side of each of the coaxial cables 104.

The capacitance value of the capacitor C2 of each of the coil elements EC1 to EC4 and the capacitance value of the capacitor C3 inserted inside each of the coaxial cables 104 are selected in such a manner that these components function as an impedance matching circuit. Note that, as to the antennas 106a to 106d connected to the control system 102 in FIG. 4, they will be explained with the later-described FIG. 7.

Figure 5:
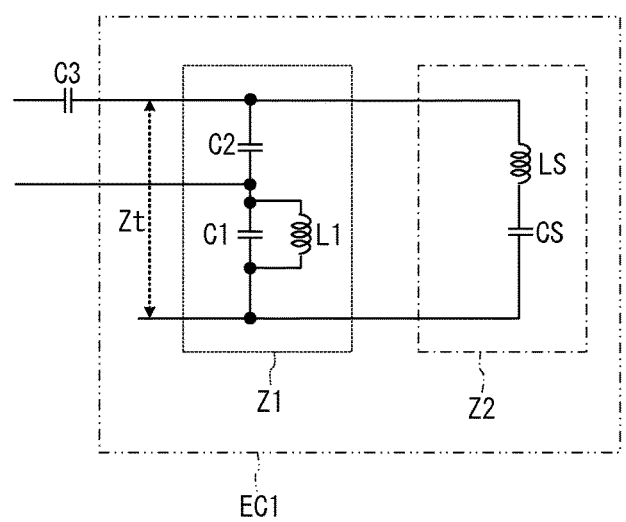
FIG. 5 is an equivalent circuit diagram in the case of assuming the coil elements EC1 in FIG. 4 to be a parallel circuit of impedance Z1 and impedance Z2.

FIG. 5 is an equivalent circuit diagram in the case of assuming the coil element EC1 in FIG. 4 to be a parallel circuit of the impedance Z1 and the impedance Z2.

The inductance component LS in FIG. 5 corresponds to the inductance of the hard-wiring of each of the coil elements EC1 to EC4 excluding the portion between the two connection nodes connected to the coaxial cable 104 in FIG. 4. That is, the inductance component of the hard-wiring that starts from the connection node of the capacitor C2 and the capacitor C3, passes through the switch SW1 and ends at the connection node of the capacitor C1, the capacitor C2 and the coaxial cable 104 is LS.

Thus, the impedance Zt of each of the coil elements EC1 to EC4 corresponds to the impedance Zt of the parallel circuit of the part of the impedance Z1 surrounded by a dashed line frame and the part of the impedance Z2 surrounded by a chain line frame.

Then, if the capacitance values of the capacitors C1, C2 and CS are respectively defined as $C_1$, $C_2$ and $C_S$, the inductance value of the coil L1 is defined as $L_1$ and the inductance value of the inductance component LS is defined as $L_S$, the first resonance frequency f1 and the second resonance frequency f2 are respectively calculated by the following equation (1) and equation (2).

$$f_1 = \frac{1}{2\pi} \cdot \sqrt{\frac{\frac{1}{2L_1 C_1} + \frac{1}{2L_S C_S} + \frac{1}{2L_S} \cdot \frac{C_1 + C_2}{C_1 C_2} +}{\sqrt{\left(\frac{1}{2L_1 C_1} + \frac{1}{2L_S C_S} + \frac{1}{2L_S} \cdot \frac{C_1 + C_2}{C_1 C_2}\right)^2 - \left(\frac{C_2 + C_S}{C_1 C_2 C_S L_1 L_S}\right)}}} \quad (1)$$

$$f_2 = \frac{1}{2\pi} \cdot \sqrt{\frac{\frac{1}{2L_1 C_1} + \frac{1}{2L_S C_S} + \frac{1}{2L_S} \cdot \frac{C_1 + C_2}{C_1 C_2} -}{\sqrt{\left(\frac{1}{2L_1 C_1} + \frac{1}{2L_S C_S} + \frac{1}{2L_S} \cdot \frac{C_1 + C_2}{C_1 C_2}\right)^2 - \left(\frac{C_2 + C_S}{C_1 C_2 C_S L_1 L_S}\right)}}} \quad (2)$$

Figure 6:
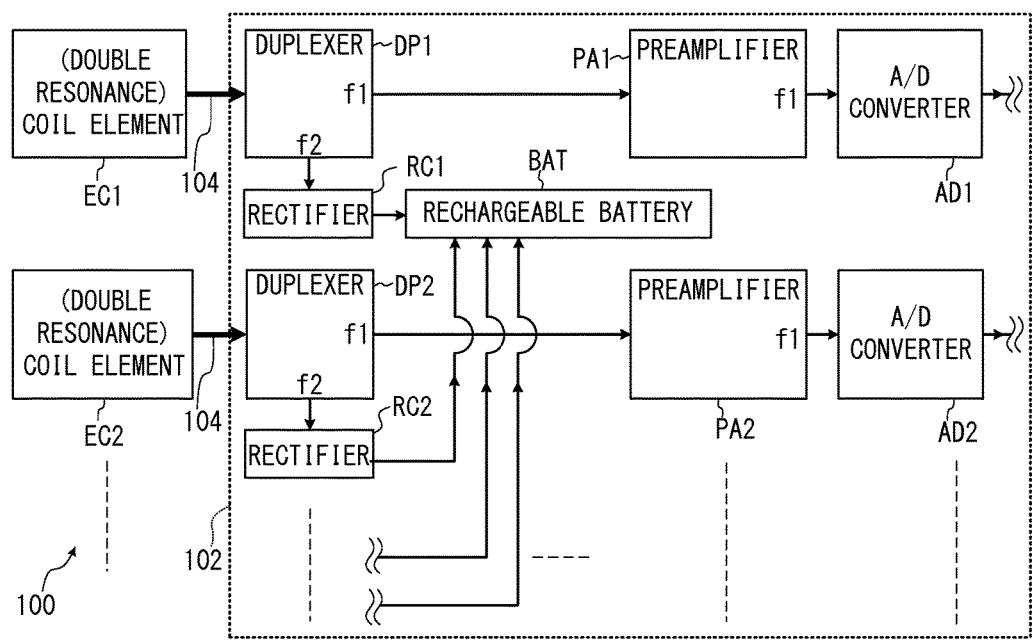
FIG. 6 is a block diagram showing the charging system and the processing system of MR signals in the control system of the RF coil device of the first embodiment.

FIG. 6 is a block diagram showing the charging system and the processing system of the MR signals in the control system 102 of the RF coil device 100 of the first embodiment. As shown in FIG. 6, the control system 102 includes a rechargeable battery BAT. Furthermore, the control system 102 includes duplexers (splitters) DP1 to DP4, preamplifiers PA1 to PA4, A/D convertors AD1 to AD4 and rectifiers RC1 to RC4 so as to respectively corresponds to the respective coil elements EC1 to EC4.

Because FIG. 6 becomes complicated if all the wires of the coil elements EC1 to EC4 are shown, only the wires of the connection destination of the coil elements EC1 and EC2 are shown in FIG. 6. Thus, the duplexers DP3 and DP4, the preamplifiers PA3 and PA4 and the A/D convertors AD3 and AD4 are not illustrated in FIG. 6.

Each of the duplexers (splitters) DP1 to DP4 is connected to each of the coil elements EC1 to EC4 via the coaxial cable 104. Here, because each of the coil elements EC1 to EC4 resonates at the first resonance frequency f1 that is tuned to the frequency (the Larmor frequency) of MR signals emitted from the object P, each of the coil elements EC1 to EC4 detects weak MR signals.

In addition, each of the coil elements EC1 to EC4 wirelessly receives alternating-current power by receiving the electromagnetic wave of the second resonance frequency f2 emitted from the whole body coil WB1 so as to resonate. The MR signals and alternating-current power received by each of the coil elements EC1 to EC4 are respectively taken in the duplexers DP1 to DP4 of the control system 102 via the coaxial cables 104.

The duplexers DP1 to DP4 extract electric current components of the first resonance frequency f1 (MR signals), and respectively input them into the preamplifiers PA1 to PA4.

In addition, the duplexers DP1 to DP4 extract electric current components of the second resonance frequency f2 (alternating-current power), and respectively input them to the rectifiers RC1 to RC4.

Each of the rectifiers RC1 to RC4 converts the alternating electric current respectively inputted from the duplexers DP1 to DP4 into direct-current electricity, and supplies the direct-current electricity to the rechargeable battery BAT as a charging current.

Each of the preamplifiers PA1 to PA4 amplifies the MR signals of the first resonance frequency f1 respectively inputted from the duplexers DP1 to DP4, and respectively inputs the amplified MR signals into the A/D convertors AD1 to AD4.

Figure 7:
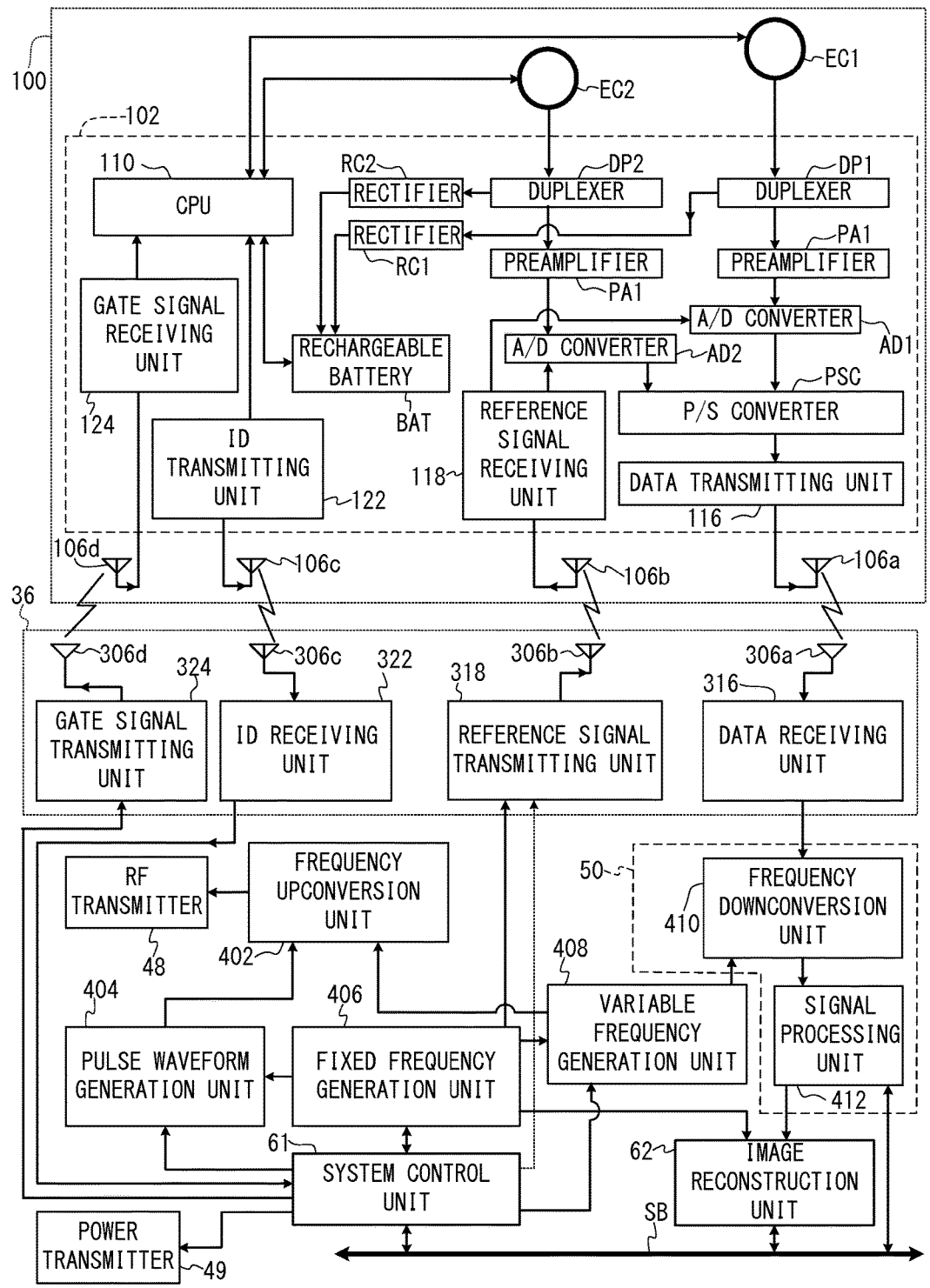
FIG. 7 is a schematic block diagram showing the respective components relevant to the digital radio communication system of the MR signals, in the MRI apparatus of the first embodiment.

The A/D convertors AD1 to AD4 digitize the inputted analogue MR signals, and input the digitized MR signals into the subsequent stage (see FIG. 7).

FIG. 7 is a schematic block diagram showing the respective components relevant to the digital radio communication system of the MR signals, in the MRI apparatus 10 of the first embodiment. In FIG. 7, only the wires of the connection destination of the coil elements EC1 and EC2 are shown while the wires of the connection destination of the other coil elements EC3 and EC4 are omitted as to the RF coil device 100 in the way similar to FIG. 6. This is because FIG. 7 becomes complicated if all the wires of the coil elements are illustrated.

As shown in FIG. 7, the control system 102 of the RF coil device 100 further includes a CPU (Central Processor Unit) 110, a P/S (Parallel/Serial) converter PSC, a data transmitting unit 116, a reference signal receiving unit 118, an ID (Identification Information) transmitting unit 122 and a gate signal receiving unit 124.

In addition, the radio communication device 36 includes antennas 306a to 306d, a data receiving unit 316, a reference signal transmitting unit 318, an ID (Identification Information) receiving unit 322 and a gate signal transmitting unit 324.

In addition, (the control device 40 of) the MRI apparatus 10 further includes a frequency upconversion unit 402, a pulse waveform generation unit 404, a fixed frequency generation unit 406 and a variable frequency generation unit 408.

In addition, the RF receiver 50 includes a frequency downconversion unit 410 and a signal processing unit 412.

As an example in the first embodiment, there are four radio communication pathways between the RF coil device 100 and the radio communication device 36. In the following, the four radio communication pathways will be explained in order.

Firstly, in the pathway between the antennas 106c and 306c, the identification information of the RF coil device 100 is wirelessly transmitted.

More specifically, for example, the ID transmitting unit 122 preliminarily stores the above identification information or obtains it from the CPU 110. The ID transmitting unit 122 adjusts the radio output power of the digital signal of the above identification information to a level appropriate for the remote radio communication, and inputs this to the antenna 106c. The antenna 106c radiates the electromagnetic waves of the digital signal of the identification information.

The antenna 306c of the radio communication device 36 detects the carrier waves radiated from the antenna 106c, and inputs them to the ID receiving unit 322. The ID receiving unit 322 extracts the identification information of the RF coil device 100 from the inputted carrier waves, and inputs the identification information to the system control unit 61. Thereby, the system control unit 61 recognizes information on an RF coil device such as which of various types of RF coil devices (for example, a chest part RF coil device) is currently connected.

Secondly, in the pathway between the antennas 106d and 306d, a digital gate signal is continuously wirelessly transmitted from the radio communication device 36 to the RF coil device 100 during imaging. The gate signal is a control signal of the switch SW1 that switches ON/OFF state of each of the coil elements EC1 to EC4.

More specifically, the gate signal transmitting unit 324 adjusts the level of radio output power of the gate signal to a level appropriate for remote radio communication, and inputs it to the antenna 306d. The antenna 306d radiates electromagnetic waves of the gate signal. The antenna 106d of the RF coil device 100 detects the carrier waves radiated from the antenna 306d, and inputs them to the gate signal receiving unit 124.

The gate signal receiving unit 124 extracts the gate signal from the inputted carrier waves, and inputs the extracted gate signal to the CPU 110. The CPU 110 switches ON/OFF state of each of the coil elements EC1 to EC4 by the switch SW1, on the basis of the gate signal.

Note that, as an alternative configuration, the trigger signal may be transmitted from the gate signal transmitting unit 324 to the gate signal receiving unit 124, and the gate signal may be generated inside the gate signal receiving unit 124 on the basis of the trigger signal.

As to timing of wirelessly transmitting electric power to the RF coil device 100, four examples will be explained with the next FIG. 8 to FIG. 11. Here, consider a case where the wireless transmission of electric power is not performed in a period during which an RF pulse is transmitted to the object P (see FIG. 10).

In a period during which an RF pulse is transmitted to the object P, the gate signal inputted from the antenna 306d to the RF coil device 100 is set to, for example, on-level. During the on-level span of the gate signal, the above switch SW1 becomes off-state so as to disconnect the loop of each of the coil elements EC1 to EC4 and thereby each of the coil elements EC1 to EC4 cannot detect MR signals nor receive alternating-current power.

Except the span during which RF pulses are transmitted to the object P, the gate signal adjusted to off-level is wirelessly transmitted. While the gate signal is off-level, the above switch SW1 becomes on-state and each of the coil elements EC1 to EC4 can detect MR signals and receive alternating-current power.

Thirdly, in the pathway between the antennas 306b and 106b, a digital reference signal is continuously wirelessly transmitted from the radio communication device 36 to the RF coil device 100 during imaging. The reference signal is a signal that synchronizes the RF coil device 100 as a transmission side of the MR signals with a basic frequency of system based on the fixed frequency generation unit 406. The reference signal transmitting unit 318 generates the reference signal by performing processing such as modulation, frequency conversion, amplification and filtering on the criterion clock signal inputted from the fixed frequency generation unit 406.

The fixed frequency generation unit 406 generates the criterion clock signal whose frequency is constant. The fixed frequency generation unit 406 includes a crystal controlled oscillator with high degree of stability and so on, in order to generate the criterion clock signal.

The fixed frequency generation unit 406 inputs the criterion clock signal to the reference signal transmitting unit 318 and the variable frequency generation unit 408. In addition, the fixed frequency generation unit 406 inputs the criterion clock signal to respective components performing clock synchronization inside the MRI apparatus 10 such as the image reconstruction unit 62 and the pulse waveform generation unit 404.

The variable frequency generation unit 408 includes PLL (Phase-Locked Loop), DDS (Direct Digital Synthesizer), and a mixer. The variable frequency generation unit 408 operates on the basis of the above criterion clock signal.

The variable frequency generation unit 408 generates a local signal (clock signal) of variable frequency that accords with a setting value inputted from the system control unit 61 as a center frequency of RF pulses.

In order to achieve this, the system control unit 61 inputs a default value of the center frequency of the RF pulses to the variable frequency generation unit 408 before a prescan. In addition, the system control unit 61 inputs a corrected value of the center frequency of the RF pulses to the variable frequency generation unit 408 after the prescan.

The variable frequency generation unit 408 inputs the above local signal of variable frequency to the frequency downconversion unit 410 and the frequency upconversion unit 402.

In addition, a trigger signal (A/D conversion start signal) that determines the timing of sampling in each of the A/D converters AD1 to AD4 of the RF coil device 100 is inputted from the system control unit 61 to the reference signal transmitting unit 318. The above sampling means, for example, to extract intensity of an analog signal at regular time intervals so as to enable digital record.

As an example here, the reference signal transmitting unit 318 wirelessly transmits both the reference signal and the trigger signal by superimposing the trigger signal on the reference signal.

More specifically, the reference signal transmitting unit 318 adjusts the level of radio output power of the reference signal on which the trigger signal is superimposed to a level appropriate for remote radio communication, and inputs it to the antenna 306b. The antenna 306b radiates electromagnetic waves of the reference signal on which the trigger signal is superimposed. The antenna 106b of the RF coil device 100 detects the carrier waves radiated from the antenna 306b, and inputs them to the reference signal receiving unit 118.

The reference signal receiving unit 118 extracts the trigger signal and the reference signal from the inputted carrier waves, and inputs them to each of the A/D convertors AD1 to AD4.

Fourthly, in the pathway between the antennas 106a and 306a, the digitized MR signals are wirelessly transmitted from the RF coil device 100 to the radio communication device 36.

More specifically, analogue MR signals detected by the coil elements selected for detecting MR signals (for at least one of the coil elements EC1 to EC4) are subjected to removal of an alternating-current power component via the duplexers (DP1 to DP4), then amplified by the preamplifiers (PA1 to PA4) and then inputted to the A/D convertor (AD1 to AD4), as explained with FIG. 6.

Each of the A/D convertors (AD1 to AD4) converts the inputted analogue MR signals into digital signals, by starting sampling and quantization on the basis of the reference signal (sampling clock signal) in synchronization with the timing when the trigger signal is transmitted.

If at least one of the coil elements (EC1 to EC4) is not selected for detecting MR signals, the preamplifier (s) (PA1 to PA4) and the A/D converter (s) (AD1 to AD4) corresponding to the non-selected coil element(s) do not operate as an example in the present embodiment.

Each of the A/D convertors (AD1 to AD4) inputs the digitized MR signals to the P/S converter PSC. If a plurality of the coil elements (EC1 to EC4) are selected for detecting MR signals, the MR signals which have been detected by these coil elements and have respectively undergone A/D conversion are plural.

In this case, the P/S converter PSC converts these plural MR signals from parallel signals into a serial signal for radio transmission, and inputs the serial signal to the data transmitting unit 116. This is because the number of antenna for transmitting the MR signals is only one (the antenna 106a) in the example of the present embodiment.

However, the present embodiment is not limited to an aspect of wirelessly transmitting the MR signals as a serial signal. For example, the MR signals may be wirelessly transmitted as parallel signals by increasing the number of antennas for transmitting and receiving MR signals.

The data transmitting unit 116 generates the MR signal for radio transmission (which is a serial and digital signal) by performing processing such as error correction encoding, interleave, modulation, frequency conversion, amplification, and filtering on the inputted serial MR signal.

The data transmitting unit 116 adjusts the level of radio output power of the MR signal for wireless transmission to a level appropriate for remote radio communication, and inputs the MR signal to the antenna 106a. The antenna 106a radiates electromagnetic waves of the MR signal. The antenna 106b of the RF coil device 100 detects the carrier waves radiated from the antenna 306b, and inputs them to the reference signal receiving unit 118.

The antenna 306a of the radio communication device 36 detects the carrier waves radiated from the antenna 106a, and input them to the data receiving unit 316. The data receiving unit 316 performs processing such as amplification, frequency conversion, demodulation, deinterleave and error correction decoding on the MR signal inputted from the antenna 306a. Thereby, the data receiving unit 316 extracts the original digitized MR signals from the MR signal for radio transmission, and inputs the extracted MR signals to the frequency downconversion unit 410 of the RF receiver 50.

The frequency downconversion unit 410 multiplies the MR signals inputted from the data receiving unit 316 by the local signal inputted from the variable frequency generation unit 408, and makes an arbitrary signal band get through by filtering. Thereby, the frequency downconversion unit 410 performs frequency conversion (downconversion) on the MR signals, and inputs the MR signals whose frequency is lowered to the signal processing unit 412.

The signal processing unit 412 generates raw data of the MR signals by performing predetermined signal processing on the above MR signals whose frequency is lowered. The raw data of the MR signals are inputted to the image reconstruction unit 62, and converted into k-space data and stored in the image reconstruction unit 62.

Note that, as to the gate signal, it may be superimposed on the reference signal in the way similar to the trigger signal. In this case, because the number of radio communication pathways can be decreased by one by omitting components such as the antennas 106d and 306d, configuration of the radio communication device 36 and the RF coil device 100 can be streamlined.

In addition, as to the respective frequencies of the signals (carrier waves) for the remote radio communication generated by the data transmitting unit 116, the ID transmitting unit 122, the reference signal transmitting unit 318 and the gate signal transmitting unit 324, it is preferable to avoid frequencies which are equal to numbers obtained by dividing the frequency of RF pulses transmitted to the object P by a natural number (in the first embodiment, the respective frequencies of the carrier waves are set in such a manner).

In addition, the RF coil device 100 and the radio communication device 36 perform frequency separation of the carrier waves of the remote radio communication. More specifically, the respective radio frequency values used in the four carrier waves of the remote radio communication generated by the data transmitting unit 116, the ID transmitting unit 122, the reference signal transmitting unit 318 and the gate signal transmitting unit 324 are widely separated.

The foregoing is an explanation of the four radio communication pathways.

In FIG. 7, the system control unit 61 determines the imaging conditions such as a repetition time, a type of RF pulses, a center frequency of the RF pulses and a band width of the RF pulses in a pulse sequence, on the basis of the imaging conditions inputted by an operator via the input device 72 (see FIG. 1). The system control unit 61 inputs the imaging conditions determined in the above manner to the pulse waveform generation unit 404.

The pulse waveform generation unit 404 generates a pulse waveform signal of baseband by using the criterion clock signal inputted from the fixed frequency generation unit 406, depending on the imaging conditions inputted from the system control unit 61 in the above manner. The pulse waveform generation unit 404 inputs the pulse waveform signal of baseband to the frequency upconversion unit 402.

The frequency upconversion unit 402 multiplies the pulse waveform signal of baseband by the local signal inputted from the variable frequency generation unit 408, then makes an arbitrary signal band pass by filtering, and thereby performs frequency conversion (upconversion). The frequency upconversion unit 402 inputs the pulse waveform signal of baseband whose frequency is raised to the RF transmitter 48.

The RF transmitter 48 generates the RF pulses on the basis of the inputted pulse waveform signal.

FIG. 8 to FIG. 11 are timing charts showing the first to fourth examples of transmission of electric power. In FIG. 8 to FIG. 11, each horizontal axis indicates elapsed time t.

In addition, each timing chart in the upper part of each of FIG. 8 to FIG. 11 shows timing of transmitting the RF pulses for imaging, and each period of the protruded triangle-shaped bold line is the transmission span of the RF pulse.

In addition, each timing chart in the middle part of each of FIG. 8 to FIG. 11 shows timing of detecting MR signals, and each period during which the bold line protrudes to form a rectangular shape is the detection span of MR signals by the coil elements (EC1 to EC4) of the RF coil device 100.

In addition, each timing chart in the bottom part of each of FIG. 8 to FIG. 11 shows timing of wirelessly transmitting electric power, electric power is transmitted in each period during which the bold line on the chart is ON-level, and electric power is not transmitted in each period during which the bold line on the chart is OFF-level.

Figure 8:
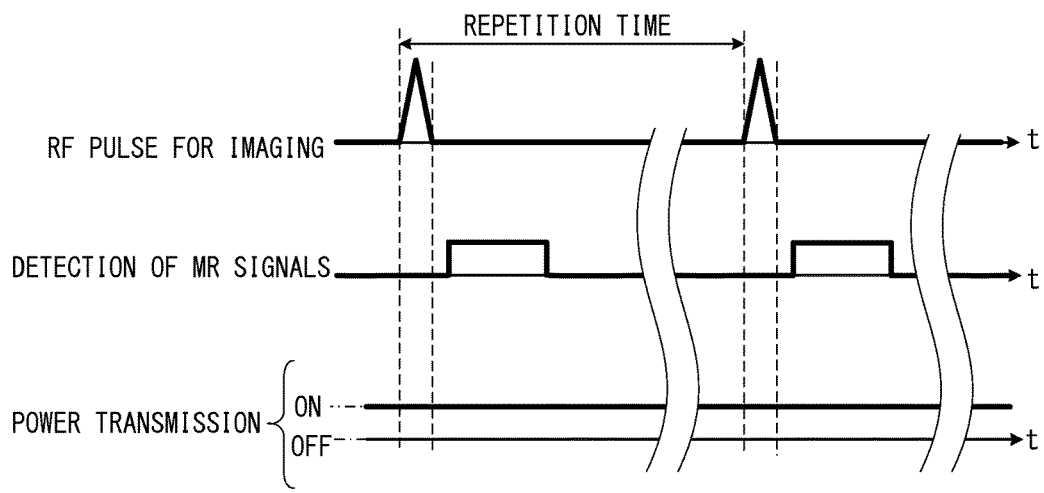
FIG. 8 is a timing chart showing the first example of transmission of electric power.

FIG. 8 corresponds to a case where electric power is wirelessly transmitted from the whole body coil WB1 to the RF coil device 100 on a steady basis. The "on a steady basis" herein means that electric power is continuously wirelessly transmitted regardless of a transmission span of an RF pulse, a detection span of MR signals or the like of a pulse sequence.

Figure 9:
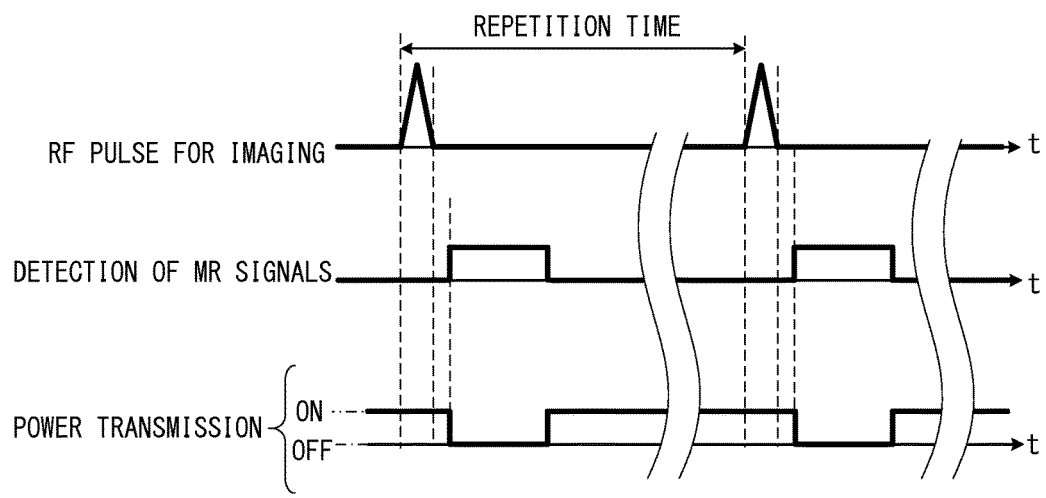
FIG. 9 is a timing chart showing the second example of transmission of electric power.

FIG. 9 corresponds to a case where electric power is wirelessly transmitted to the RF coil device 100 by avoiding only detection spans of MR signals. Such control can be achieved by outputting alternating-current power from the power transmitter 49 by avoiding only detection spans of MR signals under the control of the system control unit 61, for example.

Here, in the first embodiment, the coil elements EC1 to EC4 of the RF coil device 100 perform both detection of MR signals and reception of electric power, and the whole body coil WB1 performs both transmission of RF pulses and wireless transmission of electric power. However, this is only an example, and each function may be separately performed per coil by adding further coils.

For example, like the later-described fourth embodiment and the fifth embodiment, detection of MR signals may be performed by a coil exclusively for detection, and reception of electric power may be performed by a coil exclusively for power reception by deposing a further coil exclusively for power reception inside the RF coil device.

Alternatively, for example, like the later-described second embodiment and the third embodiment, another coil exclusively for transmitting electric power is disposed inside gantry 30 as an example, so that the whole body coil WB1 performs transmission of RF pulses and detection of MR signals and the coil exclusively for transmitting electric power wirelessly transmits electric power.

Including cases where the respective functions are allotted to different coils by disposing a further coil, for example, in the following first to third cases, it is preferable to wirelessly transmit electric power by avoiding detection spans of MR signals like FIG. 9.

Firstly, it is a case where a coupling effect is likely to occur between coils for detecting MR signals on the RF coil device side (in the first embodiment, they are the coil elements EC1 to EC4) and a coil for wirelessly transmitting electric power (in the first embodiment, it is the whole body coil WB1). The coupling effect means that a radiofrequency electric current leaks to a coil system of one side if a radiofrequency electric current is supplied to a coil system of the other side. In order to avoid this, a coil for transmitting electric power is set to off-state at the timing when MR signals are detected.

Secondly, it is a case where the coupling effect is likely to occur inside the RF coil device between a coil exclusively for detecting MR signals and a coil exclusively for receiving electric power. In order to avoid this, the coil exclusively for receiving electric power is set to off-state at the timing when MR signals are detected.

Thirdly, it is a case where a developmental period of noise overlaps a detection period of MR signals, because a circuit of receiving electric power inside the RF coil device generates noise at the time of wirelessly receiving electric power depending on conditions. In this case, the aspect of FIG. 9 is preferable because it is possible that noise mixes into detecting and processing system of MR signals. In this third case, it is not necessary to turn off the coil exclusively for receiving electric power inside the RF coil device in the detection period of MR signals, and it may be enough to stop transmission of electric power.

Figure 10:
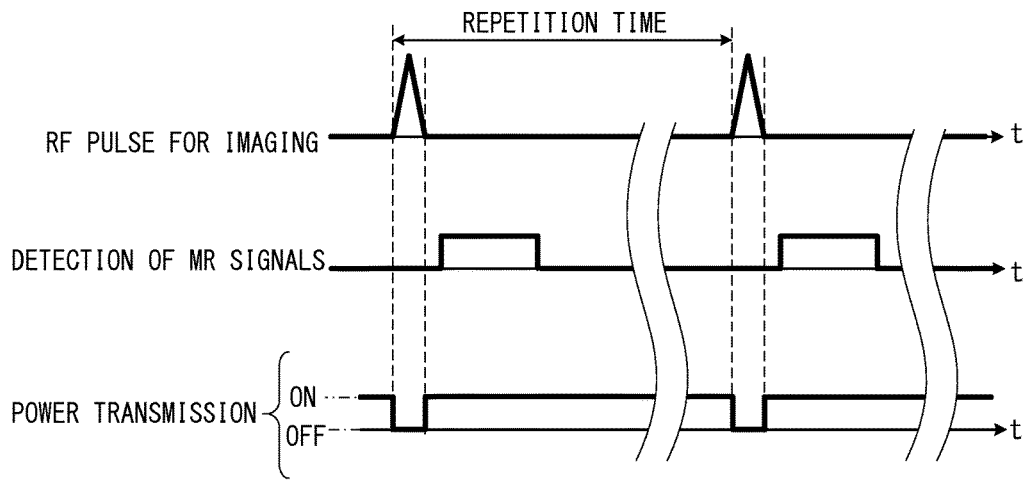
FIG. 10 is a timing chart showing the third example of transmission of electric power.

FIG. 10 corresponds to a case where electric power is wirelessly transmitted to the RF coil device 100 by avoiding only spans of transmitting RF pulses (from the RF coil unit 34). The system control unit 61 can achieve such control by controlling the power transmitter 49 so as to output alternating-current power by avoiding output spans of radio-frequency electric currents from the RF transmitter 48, for example.

Including cases where the respective functions are allotted to different coils as described earlier, for example, in the following first and second cases, it is preferable to wirelessly transmit electric power by avoiding output spans of the RF pulses like FIG. 10.

Firstly, it is a case where the coupling effect is likely to occur between a coil for transmitting the RF pulses to the object P and a coil for wirelessly transmitting electric power to the RF coil device side.

Secondly, it is a case where the coupling effect is likely to occur between a coil for transmitting the RF pulses to the object P and a coil for receiving electric power inside the RF coil device.

Figure 11:
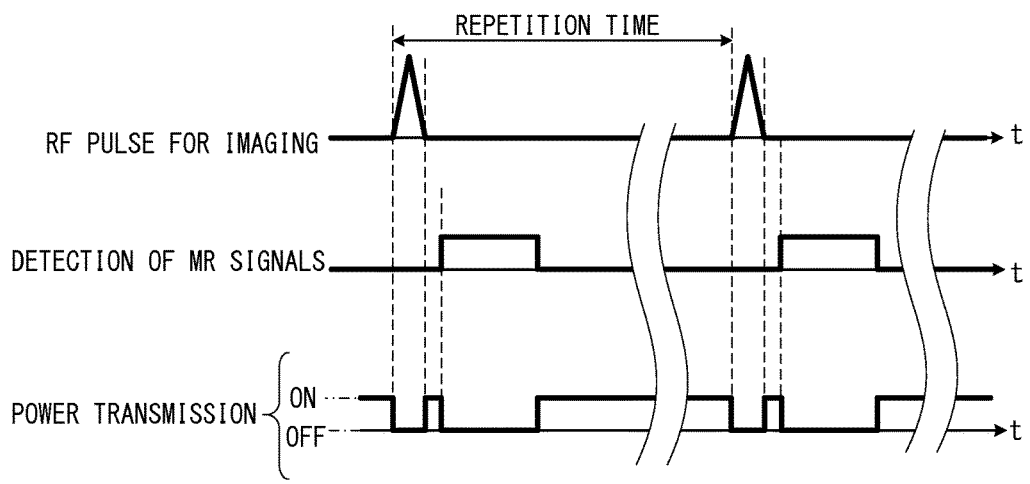
FIG. 11 is a timing chart showing the fourth example of transmission of electric power.

FIG. 11 corresponds to a case where electric power is wirelessly transmitted to the RF coil device 100 by avoiding spans of transmitting RF pulses and spans of detecting MR signals. As compared with the aspects of FIG. 8 to FIG. 10, the aspect of FIG. 11 is the most effective in terms of avoiding the coupling effect and noise contamination. More specifically, for example, the aspect of FIG. 11 is especially preferable in the case where both of the following two conditions are satisfied.

The first condition is that the coupling effect is likely to occur between (A) a coil for transmitting the RF pulse to the object P and (B) at least one of a coil for wirelessly transmitting electric power to the RF coil device side and a coil for receiving electric power inside the RF coil device.

The second condition is that the coupling effect is likely to occur between (A) a coil for detecting MR signals inside the RF coil device and (B) at least one of a coil for wirelessly transmitting electric power to the RF coil device side and a coil for receiving electric power inside the RF coil device.

Figure 12:
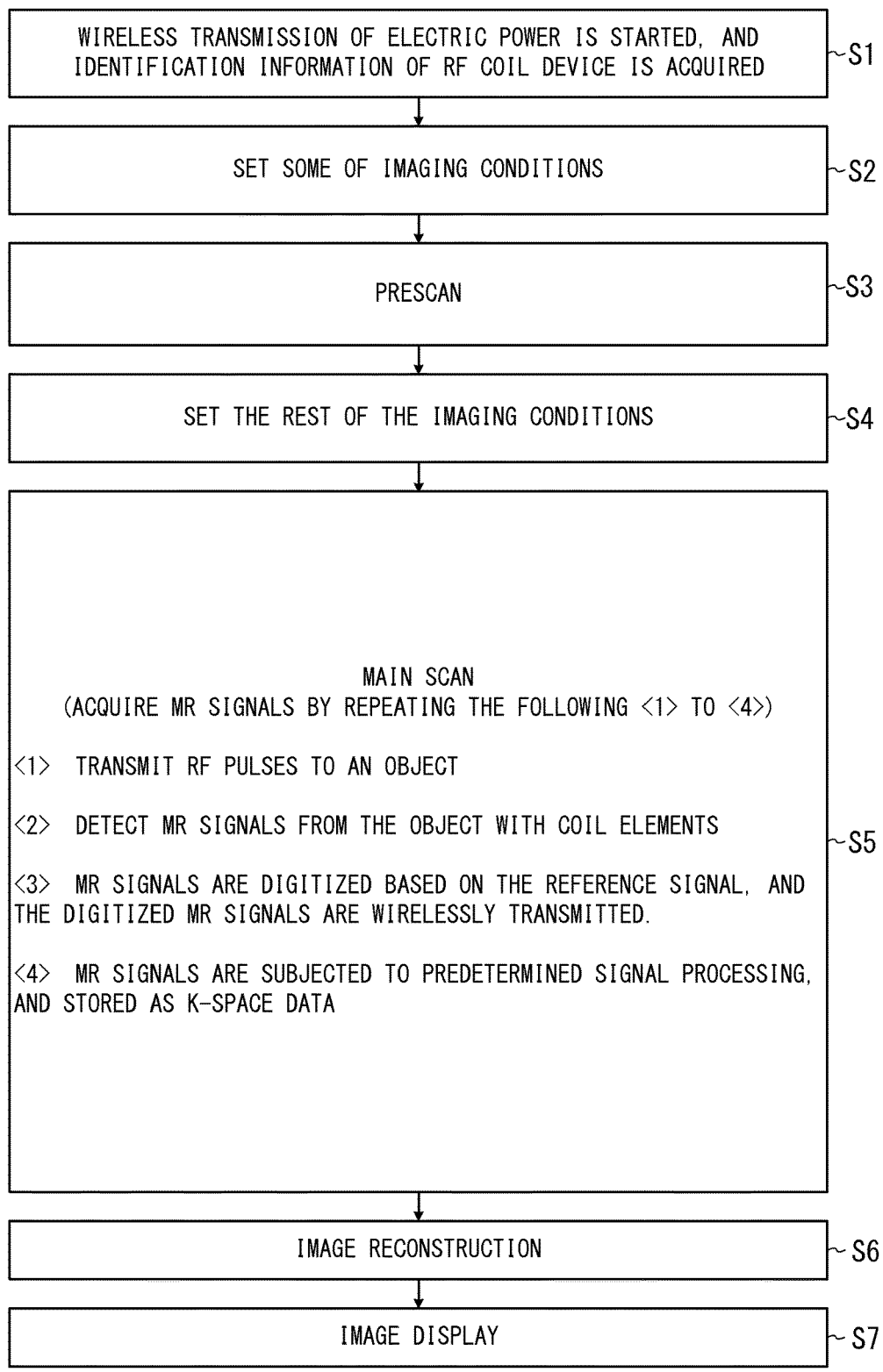
FIG. 12 is a flowchart illustrating an example of a flow of an imaging operation performed by the MRI apparatus of the first embodiment.

FIG. 12 is a flowchart illustrating an example of flow of imaging operation performed by the MRI apparatus 10 of the first embodiment. In the following, according to the step numbers in the flowchart shown in FIG. 12, an operation of the MRI apparatus 10 will be described by referring to the aforementioned FIGS. 1 to 11 as required.

[Step S1] The RF coil device 100 is loaded on the object P on the table 22 (see FIG. 1). The system control unit 61 performs initial setting of the MRI apparatus 10.

In addition, the system control unit 61 makes the power transmitter 49 and the whole body coil WB1 (see FIG. 2) start wireless transmission of the alternating-current power at the second resonance frequency f2, when it receives a command of starting power supply from the input device 72 by the operation of an operator, for example. Thereby, the coil elements EC1 to EC4 inside the RF coil device 100 receive the alternating-current power, and the rechargeable battery BAT is charged. This operation has been already explained with FIG. 3 to FIG. 6.

After the power reception, the CPU 110 of the RF coil device 100 makes the ID transmitting unit 122 wirelessly transmit the identification information of the RF coil device 100 to the ID receiving unit 322, by using the electric power from the rechargeable battery BAT. This operation has been already explained with FIG. 7.

Thereby, the system control unit 61 recognizes which RF coil device is loaded on the object P and that the wireless connection status with the RF coil device 100 is normal.

When the system control unit 61 recognizes that the wireless connection status with the RF coil device 100 is normal, the system control unit 61 outputs permission to communicate with the RF coil device 100 (communication permission) to each component of the MRI apparatus 10, and then makes the power transmitter 49 and the whole body coil WB1 continue wireless transmission of electric power.

As to the timing of wirelessly transmitting electric power, as an example here, the system control unit 61 sets it to one of the aspects of FIG. 8 to FIG. 11, depending on a type of pulse sequence.

In time of receiving electric power, i.e. in time of charging, amount of heat generation of the control system 102 of the RF coil device 100 increases. Thus, it is better to adjust the timing of wirelessly transmitting electric power depending on electric power of the transmitted RF pulses per unit time.

As the first example, when the transmitted RF pulses per unit time are few because of reasons such as a long repetition time, the system control unit 61 sets the timing of wirelessly transmitting electric power to the aspect of FIG. 8 in which electric power is transmitted on a steady basis.

As the second example, when the transmitted RF pulses per unit time are many because of reasons such as a short repetition time, the system control unit 61 adjusts the timing of wirelessly transmitting electric power like the aspects of FIG. 9 to FIG. 11.

However, the above selection method is only an example for cases where the whole body coil WB1 and the RF coil device 100 are configured so as to be unlikely to cause the coupling effect and noise contamination mentioned with FIG. 8 to FIG. 11.

Thus, as to the timing of wirelessly transmitting electric power, the system control unit 61 may set it to one of the aspects of FIG. 8 to FIG. 11 selected by an operator's operation to the input device 72. In addition, the four aspects of FIG. 8 to FIG. 11 are only examples, and the timing of wirelessly transmitting electric power is not limited to those aspects.

The reference signal transmitting unit 318 (see FIG. 7) starts inputting the digital reference signal on which the trigger signal is superimposed to the reference signal receiving unit 118 of the RF coil device 100 through the radio communication pathway between the antennas 306b and 106b, in accordance with the above communication permission (the reference signal is continuously wirelessly transmitted).

In addition, the table moving structure 23 (see FIG. 1) moves the table 22 to inside of the gantry 30 in accordance with the control by the system control unit 61.

After this, the process proceeds to Step S2.

[Step S2] The system control unit 61 sets some of the imaging conditions of the main scan on the basis of the imaging conditions inputted to the MRI apparatus 10 via the input device 72 and information on the currently used RF coil device acquired in Step S1 (in this example, information indicating that the RF coil devices 100 is used). After this, the process proceeds to Step S3.

[Step S3] The system control unit 61 makes the MRI apparatus 10 perform prescans by controlling each component of the MRI apparatus 10. In the prescans, for example, a corrected value of the center frequency of the RF pulses is calculated.

After this, the process proceeds to Step S4.

[Step S4] The system control unit 61 sets the rest of the imaging conditions of the main scan on the basis of the execution results of the prescans. The imaging conditions include information on which of the coil elements EC1 to EC4 are used for detecting MR signals in the main scan.

Thus, the system control unit 61 inputs the information on the coil elements used for the main scan into the CPU 110 of the RF coil device 100 via any one of the radio communication pathways. This information is, for example, wirelessly transmitted from the gate signal transmitting unit 324 to the gate signal receiving unit 124, and then inputted into the CPU 110 from the gate signal receiving unit 124.

After this, the process proceeds to Step S5.

[Step S5] The system control unit 61 makes the MRI apparatus 10 perform the main scan by controlling each component thereof.

More specifically, a static magnetic field is formed in the imaging space by the static magnetic field magnet 31 excited by the static magnetic field power supply 42. In addition, electric currents are supplied from the shim coil power supply 44 to the shim coil 32, and thereby the static magnetic field formed in the imaging space is uniformed.

Note that, during the implementation term of the main scan, the aforementioned gate signal is continuously wirelessly transmitted between the antennas 306d and 106d from the gate signal transmitting unit 324 to the gate signal receiving unit 124.

After this, when the system control unit 61 receives a command of start of imaging from the input device 72, the MR signals from the object P are acquired (collected) by repeating the following processes of <1> to <4> in series.

<1> The system control unit 61 drives the gradient magnetic field power supply 46, the RF transmitter 48 and the RF receiver 50 in accordance with the pulse sequence, thereby the gradient magnetic fields are formed in the imaging region including the imaging part of the object P, and the RF pulses are transmitted from (the whole body coil WB1 or the like of) the RF coil unit 34 to the object P.

When electric power is wirelessly transmitted at the timing shown in FIG. 10 or FIG. 11, the gate signal is adjusted to, for example, on-level only in the period during which an RF pulse is transmitted to the object P. In this case, the gate signal of on-level is inputted from the gate signal receiving unit 124 of the RF coil device 100, then each of the coil elements EC1 to EC4 of the RF coil device 100 becomes off-state and thereby the coupling effect is prevented.

When electric power is wirelessly transmitted at the timing shown in FIG. 8 or FIG. 9, the gate signal is kept off-level because electric power is received by the coil elements EC1 to EC4 in the period during which an RF pulse is transmitted to the object P.

<2> When electric power is wirelessly transmitted at the timing explained with FIG. 10 or FIG. 11, each of the gate signals is switched over to off-level after transmission of the RF pulses, and each of the coil elements (at least one of EC1 to EC4) selected for detecting MR signals in the Step S4 detects the MR signals caused by nuclear magnetic resonance inside the object P.

When electric power is wirelessly transmitted at the timing explained with FIG. 8 or FIG. 9, the gate signals are kept off-level and the MR signals are detected in the same way as mentioned above.

The detected MR signals are inputted to the duplexers (DP1 to DP4), the preamplifiers (PA1 to PA4), the A/D convertor (AD1 to AD4) in order, as explained with FIG. 6 and FIG. 7.

<3> Each of the A/D converters (AD1 to AD4) corresponding to the coil elements (at least one of EC1 to EC4) selected for detecting MR signals starts sampling and quantization of the MR signals on the basis of the reference signal, in synchronization with the timing when the trigger signal is transmitted. Each of the A/D converters (AD1 to AD4) inputs the digitized MR signals to the P/S converter PSC.

The P/S converter 214 converts the inputted single or plural MR signal(s) into a serial signal, and inputs the serial signal to the data transmitting unit 116.

The data transmitting unit 116 generates the MR signal for radio transmission by performing predetermined processing on the serial signal of the MR signal, and wirelessly transmits the serial signal from the antenna 106a to the antenna 306a.

<4> The data receiving unit 316 of the radio communication device 36 extracts the original digital MR signals from the MR signal for radio transmission received by the antenna 306a, per coil element.

The data receiving unit 316 inputs each of the MR signals extracted per coil element to the frequency downconversion unit 410 of the RF receiver 50.

Note that, not only the RF coil device 100 but also the reception RF coil device 24 are used for detecting MR signals, the MR signals detected by the respective coil elements inside the reception RF coil device 24 are inputted to the frequency downconversion unit 410 of the RF receiver 50 by wire.

The frequency downconversion unit 410 performs frequency downconversion on the inputted MR signals, and inputs the MR signals whose frequency is lowered to the signal processing unit 412.

The signal processing unit 412 generates raw data of the MR signals by performing predetermined processing on the inputted MR signals. The raw data of the MR signals are inputted to the image reconstruction unit 62, and converted into k-space data and stored in the image reconstruction unit 62.

After completing the acquisition of the MR signals detected by the coil element(s) of the RF coil device 100 by repeating the above <1> to <4> processes, the process proceeds to Step S6.

Note that, even in the implementation term of the above <1> to <4> processes, the RF coil device 100 performs the operation of wirelessly receiving electric power continuously (see FIG. 8) or partially intermittently (see FIG. 9 to FIG. 11).

[Step S6] The image reconstruction unit 62 reconstructs image data by performing image reconstruction processing including Fourier transformation on the k-space data.

The image reconstruction unit 62 stores the reconstructed image data in the image database 63.

After this, the process proceeds to Step S7.

[Step S7] The image processing unit 64 obtains the image data from the image database 63 and generates display image data by performing predetermined image processing on the obtained image data. The image processing unit 64 stores the display image data in the storage device 76.

Then, the system control unit 61 transmits the display image data to the display device 74, and makes the display device 74 display images indicated by the display image data.

Note that, as an example in FIG. 12, the input of the reference signal starts in Step S1. However, this is only an example. For example, the input of the reference signal may start just before the prescans in Step S3 (i.e. after setting the imaging conditions in Step S2).

The foregoing is a description of the operation of the MRI apparatus 10 according to the first embodiment.

As just described, in the first embodiment, the whole body coil WB1 and the coil elements EC1 to EC4 are configured as circuits of the double resonance system, their first resonance frequency f1 is set to the common value, and their second resonance frequency f2 is also set to the common value.

That is, the whole body coil WB1 transmits an RF pulse to the object P by resonating at the first resonance frequency f1, and wirelessly transmits electric power as electromagnetic waves to the RF coil device 100 by resonating at the second resonance frequency f2. Then, the coil elements EC1 to EC4 detect the MR signals from the object P by resonating at the first resonance frequency f1, and receive the wirelessly transmitted electric power by resonating at the second resonance frequency f2.

Because of the wireless transmission of the alternating-current power on the basis of the magnetically coupled resonant type wireless power transfer, electric power can be transmitted, even if the RF coil device 100 of the power receiving side is located separately from the power transmission side to some extent.

That is, according to the MRI apparatus 10 of the first embodiment, electric power can be wirelessly transmitted to the RF coil device satisfactorily and effectively by the magnetically coupled resonant type wireless power transfer, in the structure of wirelessly transmitting MR signals detected by the RF coil device to a control side of an MRI apparatus.

In addition, because the whole body coil WB1 has the double resonance system in the first embodiment, it is not necessary to separately provide another coil for transmitting electric power. That is, as a merit of the first embodiment, it is not necessary to secure space inside the gantry 30 for another coil of transmitting electric power.

In addition, because each of the coil elements EC1 to EC4 of the RF coil device 100 has the double resonance system in the first embodiment, it is not necessary to separately provide another coil for receiving electric power. That is, without further enlarging the size of the RF coil device 100, electric power can be received under the magnetically coupled resonant type wireless power transfer.

In addition, as described as the first example to the fourth example in Step S1, the system control unit 61 sets the timing of wirelessly transmitting electric power depending on a type of pulse sequence. That is, the timing of wirelessly transmitting electric power is set to an appropriate one of FIG. 8 to FIG. 11 in accordance with conditions such as a type of pulse sequence, required image quality and so on.

The Second Embodiment

The difference between the second embodiment and the first embodiment is as follows. That is, in the second embodiment, the whole body coil WB2 does not have a function of transmitting electric power and another coil for transmitting electric power is separately provided inside the gantry 30.

Figure 13:
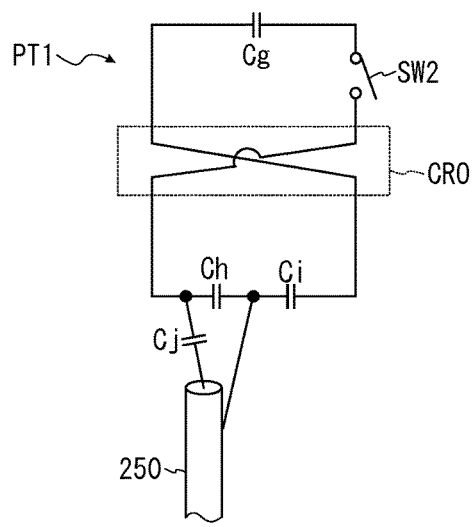
FIG. 13 is an equivalent circuit diagram of the power transmitting coil of the MRI apparatus of the second embodiment.

FIG. 13 is an equivalent circuit diagram of the power transmitting coil PT1 of the MRI apparatus 10 of the second embodiment. The power transmitting coil PT1 is composed by inserting a switch SW2 and the capacitors Cg, Ch and Ci in series in eight-letter shaped hard-wiring.

The resonance frequency of the power transmitting coil PT1 is equal to the frequency for transmitting electric power, i.e. the second resonance frequency f2 in the first embodiment. The circuit constants of the power transmitting coil PT1 such as the respective capacitance values of the capacitors Cg, Ch and Ci are selected so as to satisfy the above resonance frequency.

Although electric power can be transmitted so as to avoid a predetermined period like FIG. 9 to FIG. 11 by the output control of the power transmitter 49, it can be transmitted so as to avoid a predetermined period by switching ON/OFF state of the switch SW2.

In addition, one end side of a power transmission cable 250 is connected to both ends of the capacitor Ch.

The other end of the power transmission cable 250 is connected to the power transmitter 49 (see later-described FIG. 19). A capacitor Cj is inserted in one end side of the power transmission cable 250.

The respective capacitance values of the capacitor Ch and the capacitor Cj are selected in such a manner that the capacitor Ch and the capacitor Cj function as an impedance matching circuit.

Figure 14:
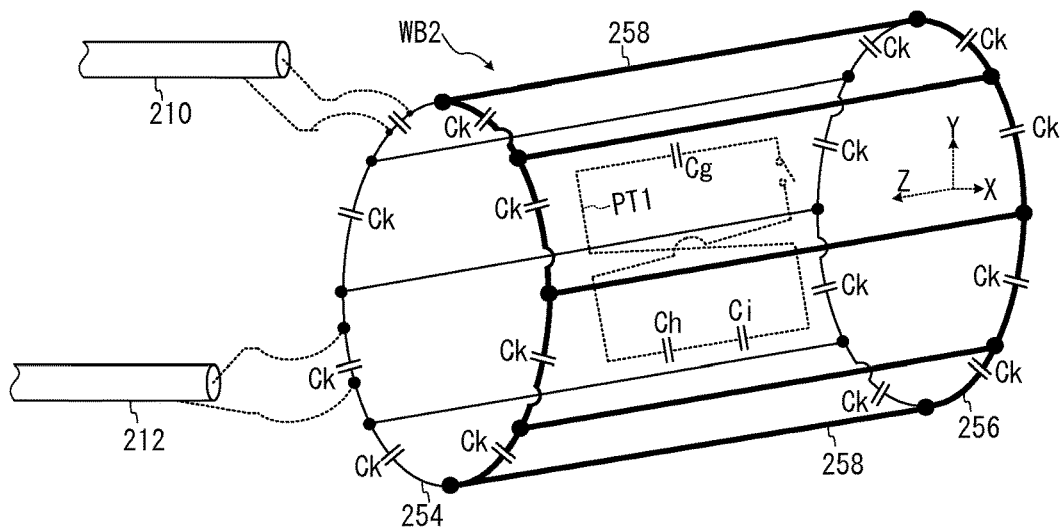
FIG. 14 is a schematic oblique drawing showing an equivalent circuit of the whole body coil and an example of the layout of the power transmitting coil of the MRI apparatus of the second embodiment.

FIG. 14 is a schematic oblique drawing showing an equivalent circuit of the whole body coil WB2 and an example of the layout of the power transmitting coil PT1 of the MRI apparatus 10 of the second embodiment.

In the way similar to FIG. 2, the conducting wires of the circuit of the whole body coil WB2 located on the near side in the X axis direction are indicated by bold lines, and the conducting wires located on the remote side in the X axis direction are indicated by fine lines.

In addition, as to each of the points where one conducting wire intersects with another conducting wire, electrically connected points are indicated by filled circle and non-connected points are distinguished from the electrically connected points by semicircularly indicating no connection between the conducting wires.

In addition, for the sake of distinction, in FIG. 14, the wires of the power transmitting coil PT1 are indicated by dashed lines and the power transmission cable 250 is omitted in order to avoid complication.

The whole body coil WB2 includes the first loop conductor 254, the second loop conductor 256, eight connecting conductors (rung) 258 and sixteen capacitors Ck.

In FIG. 14, the first loop conductor 254 corresponds to the ring on the left side in parallel with an X-Y plane, and the second loop conductor 256 corresponds to the ring on the right side in parallel with an X-Y plane.

The connecting conductors 258 correspond to eight straight lines extending along the Z axis direction as an example in FIG. 14. Each of the eight connecting conductors 258 is connected to the first loop conductor 254 on its one end and is connected to the second loop conductor 256 on its other end.

In the first loop conductor 254, the ring includes eight connection nodes connecting itself to the eight connecting conductors 258, and eight capacitors Ck are inserted between two of the eight connection nodes one by one. The same holds true for the second loop conductor 256.

As just described, the whole body coil WB2 is a bird cage type, and its circuit constants are selected in such a manner that its resonance frequency becomes the Larmor frequency. The circuit constants herein mean the capacitance value of the capacitor Ck, the inductance value of each wire of the first loop conductor 254, the second loop conductor 256 and the connecting conductor 258 or the like.

Because the whole body coil WB2 is a bird cage type of eight elements, it is supplied with electric power by the QD system from the respective connection nodes whose angles are mutually different by 90 degrees in the way similar to the first embodiment. More specifically, the high frequency transmitting and receiving cables 210 and 212 are respectively connected to positions having mutually different angles by 90 degrees in the first loop conductor 254.

Note that, the connection wires of these high frequency transmitting and receiving cables 210 and 212 to the whole body coil WB2 are respectively indicated by dashed lines in FIG. 14 for distinction.

In addition, the power transmitting coil PT1 is arranged to the interior side of the whole body coil WB2 (i.e. the interior side of the RF coil unit 34) inside the gantry 30, for example.

In the example of FIG. 14, the power transmitting coil PT1 is arranged, in such a manner that its intersection part CRO of the eight-letter shape (the part indicated by a dashed line frame in FIG. 13) becomes in parallel with the Z axis direction (the extending direction of the connecting conductors 258).

Figure 15:
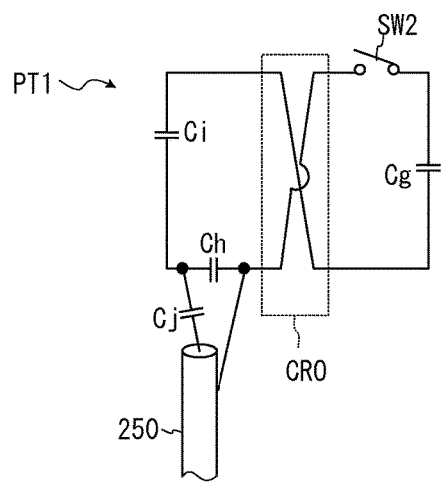
FIG. 15 is an equivalent circuit diagram of the power transmitting coil observed from a direction different from FIG. 13 in the second embodiment.
Figure 16:
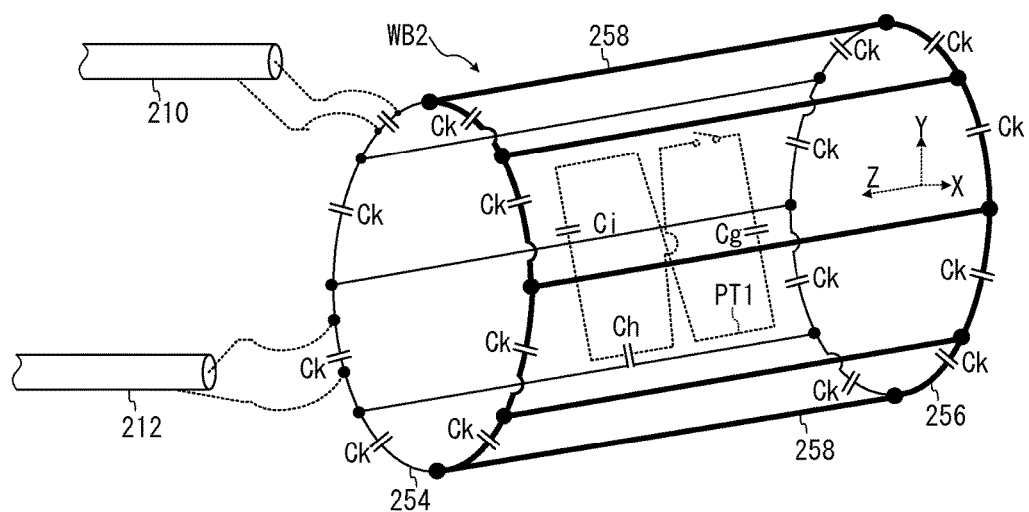
FIG. 16 is a schematic oblique drawing showing another example of the layout of the power transmitting coil to the whole body coil in the second embodiment, in the same notation as FIG. 14.

However, as to the layout of the power transmitting coil PT1, the layout shown in FIG. 14 is only an example and its layout direction may be changed like the following FIG. 15 and FIG. 16.

FIG. 15 is an equivalent circuit diagram of the power transmitting coil PT1 observed from a direction different from FIG. 13.

FIG. 16 is a schematic oblique drawing showing another example of the layout of the power transmitting coil PT1 to the whole body coil WB2, in the same notation as FIG. 14. FIG. 15 describes the intersection part CRO of the eight-letter shape in the vertical direction of the paper in the same manner as FIG. 16, for easier comparison with FIG. 16.

In the layout of FIG. 16, the power transmitting coil PT1 is arranged, in such a manner that its intersection part CRO of the eight-letter shape is orthogonal to the Z axis direction (the extending direction of the connecting conductors 258).

Although the power transmitting coil PT1 practically sufficiently functions regardless of whether it is arranged in the direction shown in FIG. 14 or FIG. 16, the power transmitting coil PT1 is arranged in the direction shown in FIG. 16 as an example in the second embodiment. This is because the layout of FIG. 16 is considered to be slightly more effective than the layout of FIG. 14 for the reason explained with FIG. 17 as follows.

Figure 17:
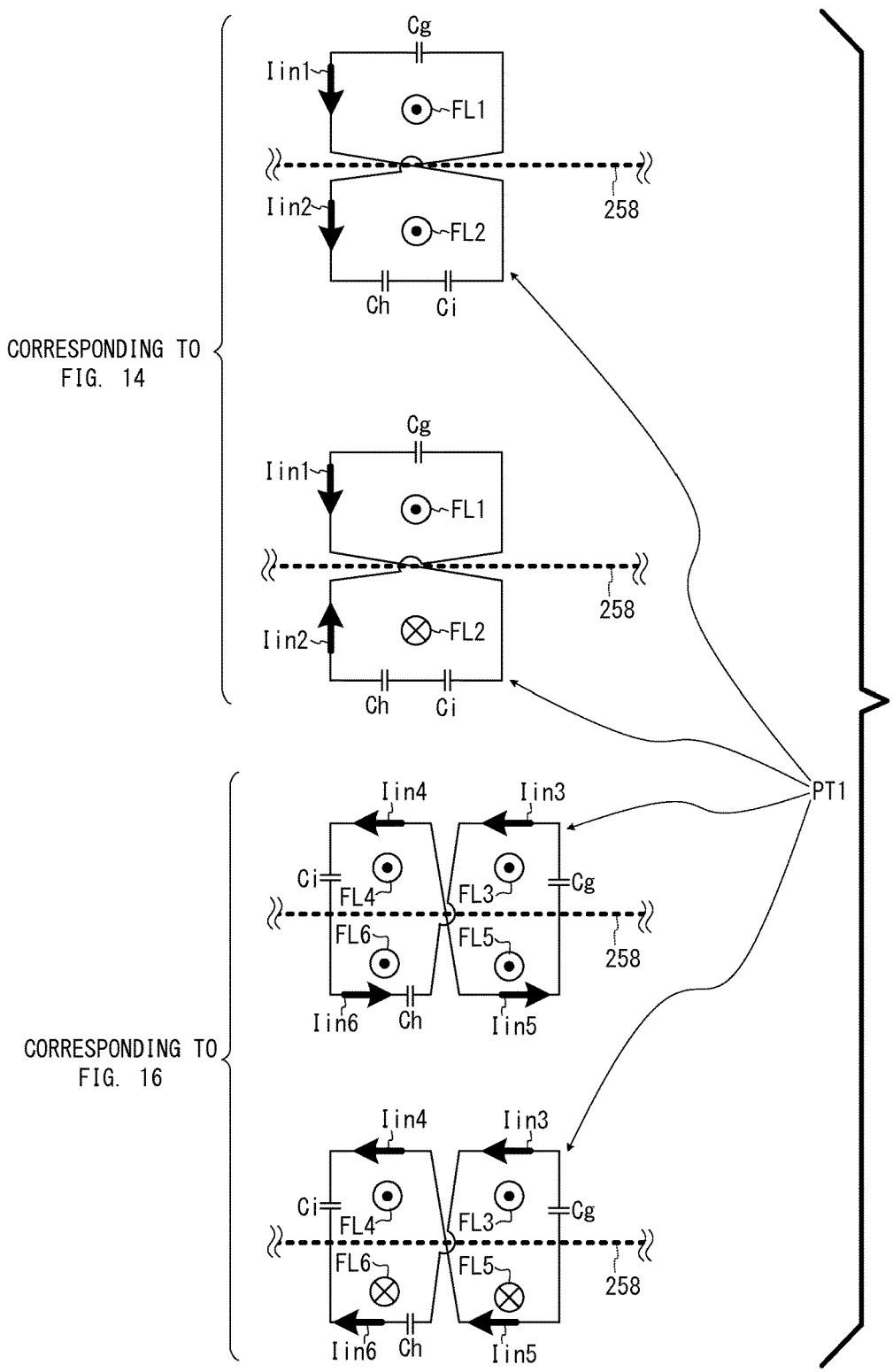
FIG. 17 is an explanatory diagram showing a comparison between the layout of FIG. 14 and the layout of FIG. 16 in terms of existence or non-existence of a coupling effect by the magnetic fluxes passing through the power transmitting coil.

FIG. 17 is an explanatory diagram showing a comparison between the layout of FIG. 14 and the layout of FIG. 16, in terms of existence or non-existence of the coupling effect by the magnetic fluxes passing through the power transmitting coil PT1.

The upper half of FIG. 17 corresponds to the layout of FIG. 14, and the lower half of FIG. 17 corresponds to the layout of FIG. 16. In FIG. 17, the switch SW2 is omitted under the assumption that the switch SW2 is in a conduction state.

Here, a high frequency magnetic field of the RF pulse transmitted from the whole body coil WB2 to the object P actually rotates in an X-Y plane, for example.

Thus, the direction of magnetic fluxes passing through the power transmitting coil PT1 is not uniquely determined.

Accordingly, the case where the possibility of causing the coupling effect with the whole body coil WB2 is comprehensively lower is desirable in consideration of various generation patterns of magnetic fluxes.

First, consider the layout of FIG. 14.

As shown in the top part of FIG. 17, it is assumed that the direction of the magnetic flux FL1 on the upper side of the intersection part CRO of the eight-letter shape is the same as the direction of the magnetic flux FL2 on its lower side. In this case, the electric current Iin1 in the downward direction of FIG. 17 is induced by the magnetic flux FL1 in the upper side of the intersection part CRO, and the electric current Iin2 in the downward direction of FIG. 17 is induced by the magnetic flux FL2 in the lower side of the intersection part CRO. However, because the power transmitting coil PT1 has eight-letter shaped wiring structure, the flowing direction of the electric current Iin1 is opposite to that of the electric current Iin2 in terms of circuit, these two cancel each other flow, and thus the coupling effect is not caused.

On the other hand, as shown in the second top part of FIG. 17, it is assumed that the direction of the magnetic flux FL1 on the upper side of the intersection part CRO of the eight-letter shape is opposite to the direction of the magnetic flux FL2 on its lower side. In this case, the electric current Iin1 in the downward direction of FIG. 17 is induced by the magnetic flux FL1 in the upper side of the intersection part CRO, and the electric current Iin2 in the upward direction of FIG. 17 is induced by the magnetic flux FL2 in the lower side of the intersection part CRO. Because the flowing direction of the electric current Iin1 is the same as the electric current Iin2 due to the eight-letter shaped wiring structure, the coupling effect is likely to be caused.

Next, consider the layout of FIG. 16.

As shown in the second bottom part of FIG. 17, as to the right side of the intersection part CRO of the eight-letter shape, it is assumed that the magnetic flux FL3 passes through the upper side and the magnetic flux FL5 passes through the lower side.

Similarly, as to the left side of the intersection part CRO of the eight-letter shape, it is assumed that the magnetic flux FL4 passes through the upper side and the magnetic flux FL6 passes through the lower side.

Furthermore, it is assumed that these magnetic fluxes FL3 to FL6 are in the same direction.

In this case, the electric currents Iin3 and Iin5 are induced in the same direction in terms of circuit by the magnetic fluxes FL3 and FL5, and the same applies to the electric currents Iin4 and Iin6 induced by the magnetic fluxes FL4 and FL6. The flowing direction of the electric current Iin3 and Iin5 becomes opposite to the flowing direction of the electric currents Iin4 and Iin6. That is, the electric currents Iin3 and Iin5 counterbalance the electric currents Iin4 and Iin6, and thus the coupling effect is not caused.

On the other hand, as shown in the bottom part of FIG. 17, it is assumed that the direction of the magnetic fluxes FL3 and FL4 on the upper side is opposite to the direction of the magnetic fluxes FL5 and FL6.

In this case, the electric currents Iin3 and Iin6 are induced in the same direction in terms of circuit by the magnetic fluxes FL3 and FL6, and the same applies to the electric currents Iin4 and Iin5 induced by the magnetic fluxes FL4 and FL5. The flowing direction of the electric current Iin3 and Iin6 becomes opposite to the flowing direction of the electric currents Iin4 and Iin5. That is, the electric currents Iin3 and Iin6 counterbalance the electric currents Iin4 and Iin5, and thus the coupling effect is not caused.

Thus, the layout of FIG. 16 does not cause the coupling effect regardless of the direction of the magnetic flux on the upper side of FIG. 17 and the direction of the magnetic flux on the lower side of FIG. 17 are the same or opposite to each other. Accordingly, the layout of FIG. 16 is less likely to cause the coupling effect than the layout of FIG. 14. Thus, it is considered that the layout of FIG. 16 is slightly more preferable than the layout of FIG. 14.

As just described, the arrangement direction of the power transmitting coil PT1 has been explained in relation to the Z axis direction (the extending direction of the connecting conductor 258).

Next, the layout of the power transmitting coil PT1 will be explained in relation to the position of the RF coil device 100.

Figure 18:
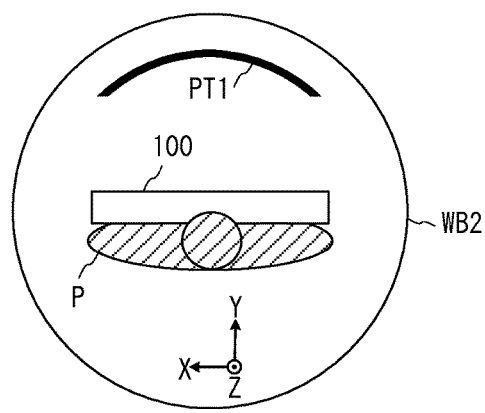
FIG. 18 is a schematic cross-sectional diagram showing an example of the layout of the power transmitting coil indicated by the positional relation with the RF coil device, in the second embodiment.

FIG. 18 is a schematic cross-sectional diagram showing an example of the layout of the power transmitting coil PT1 indicated by the positional relation with the RF coil device 100, in the second embodiment. When the RF coil device 100 is loaded on the upper side of the object P in the Y axis direction (the vertical direction), it is preferable that the power transmitting coil PT1 is disposed to the upper side in the vertical direction inside the gantry 30 as shown in FIG. 18.

This is because electric power can be wirelessly transmitted more effectively if the power transmission side and the power receiving side are close to each other.

Figure 19:
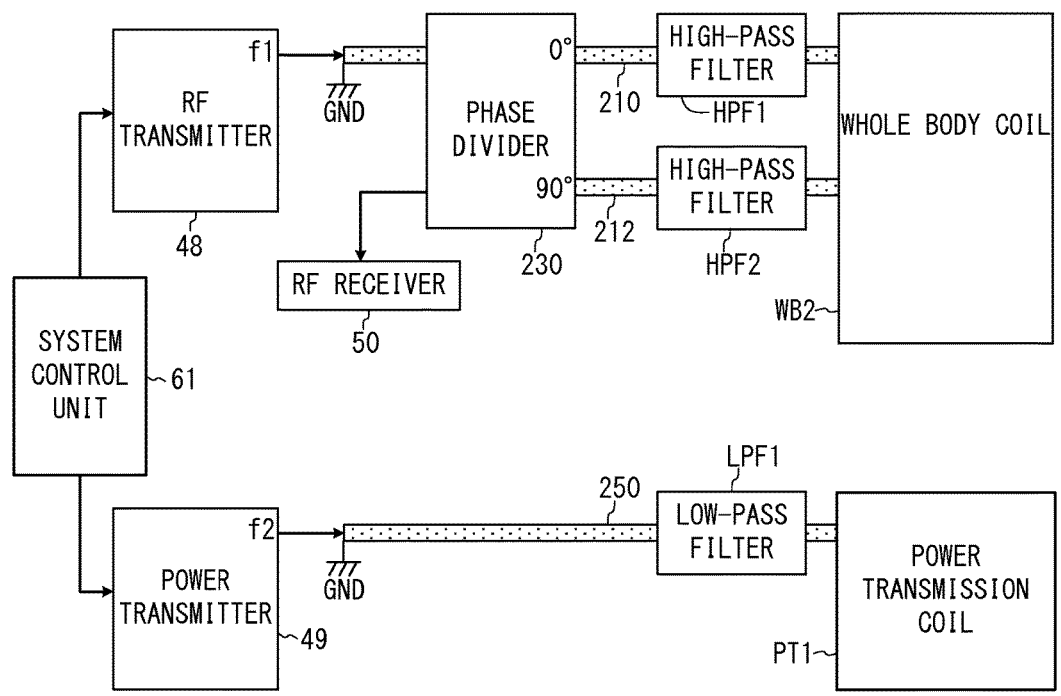
FIG. 19 is a block diagram showing the respective components relevant to the transmission system of the RF pulses and the transmission system of electric power in the second embodiment, in the same notation as FIG. 3.

FIG. 19 is a block diagram showing the respective components relevant to the transmission system of the RF pulses and the transmission system of electric power of the second embodiment, in the same notation as FIG. 3. The RF pulses of the Larmor frequency are inputted from the RF transmitter 48 side to the whole body coil WB2 by the QD system, and MR signals detected by the whole body coil WB2 are taken in the RF receiver 50 side. This point is the same as the first embodiment.

On the other hand, because the power transmitting coil PT1 is further (separately) provided in the second embodiment, alternating-current power (whose frequency is equal to the second resonance frequency f2 in the first embodiment) for wireless transmission is supplied from the power transmitter 49 to the power transmitting coil PT1 without going through a phase divider.

The functions of the high pass filters HPF1 and HPF2 and the low pass filter LPF1 shown in FIG. 19 are respectively the same as the first embodiment.

The foregoing is the explanation of the structure of the MRI apparatus 10 of the second embodiment, and imaging operation of the second embodiment is the same as that of the first embodiment explained with FIG. 12. That is, the timing of wirelessly transmitting electric power is set to the appropriate one of FIG. 8 to FIG. 11, in accordance with a type of pulse sequence.

As just described, the same effects as the first embodiment are obtained in the second embodiment.

As compared with the first embodiment, though the layout space for the power transmitting coil PT1 is further secured, the phase divider 232 in the power transmission side and one of the low pass filters can be omitted in the second embodiment (see FIG. 3 and FIG. 19).

The Third Embodiment

The structure of the MRI apparatus 10 of the third embodiment is the same as the second embodiment, except that the structure of the power transmitting coil is changed from eight-letter shape to a loop type. Thus, only the difference between the third embodiment and the second embodiment will be explained.

Figure 20:
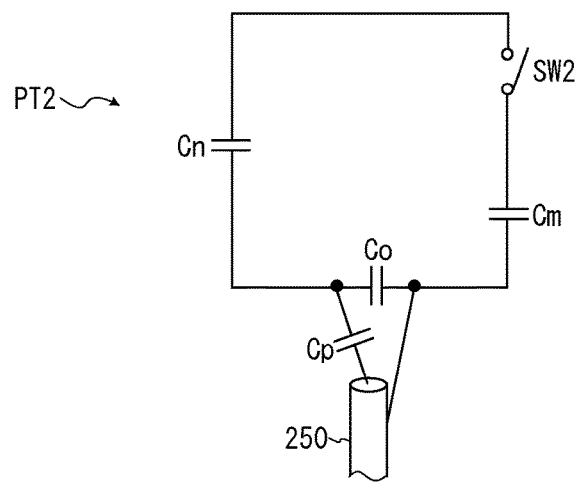
FIG. 20 is an equivalent circuit diagram of the power transmitting coil of the MRI apparatus of the third embodiment.

FIG. 20 is an equivalent circuit diagram of the power transmitting coil PT2 of the MRI apparatus 10 of the third embodiment. The power transmitting coil unit PT2 is composed by inserting a switch SW2, capacitors Cm, Cn and Co in series in loop-shape hard-wiring.

The resonance frequency of the power transmitting coil unit PT2 is equal to the frequency for power transmission (which is equal to the second resonance frequency f2 of the first embodiment). The circuit constants of the power transmitting coil unit PT2 such as the respective capacitance values the capacitors Cm, Cn and Co are selected so that the resonance frequency of the power transmitting coil unit PT2 becomes the above frequency for power transmission. The switch SW2 functions in the same way as the second embodiment.

In addition, one end side of the power transmission cable 250 is connected to both ends of the capacitor Co. The other end side of the power transmission cable 250 is connected to the power transmitter 49. The capacitor Cp is inserted in the one end side of the power transmission cable 250.

The respective capacitance values of the capacitor Co and the capacitor Cp are selected, in such a manner that the capacitor Co and the capacitor Cp function as an impedance matching circuit.

Figure 21:
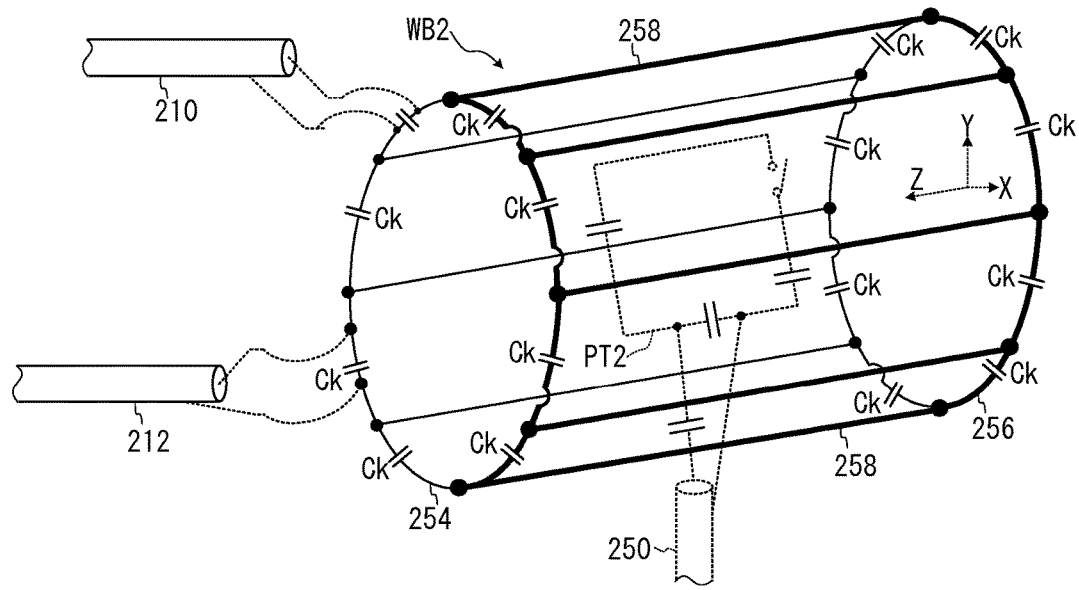
FIG. 21 is a schematic oblique drawing showing an example of the layout of the power transmitting coil of the third embodiment, in the same notation as FIG. 14.

FIG. 21 is a schematic oblique drawing showing an example of the layout of the power transmitting coil PT2 of the third embodiment, in the same notation as FIG. 14. The power transmitting coil unit PT2 is disposed to the interior side of the whole body coil WB2 (the interior side of the RF coil unit 34) inside the gantry 30 as shown in FIG. 21, for example.

In addition, similarly to the second embodiment, it is preferable that the power transmitting coil unit PT2 is disposed to the upper side in the vertical direction if the RF coil device 100 is loaded on the upper side of the object P in the Y axis direction (vertical direction).

As just described, the same effects as the second embodiment are obtained in the third embodiment.

The Fourth Embodiment

The MRI apparatus 10 of the fourth embodiment has the same structure as the MRI apparatus 10 of the first embodiment, except that a power receiving coil is separately provided inside the RF coil device.

That is, the structure of the power transmission side is the same as the first embodiment, and only the difference between the fourth embodiment and the first embodiment will be explained as follows.

Figure 22:
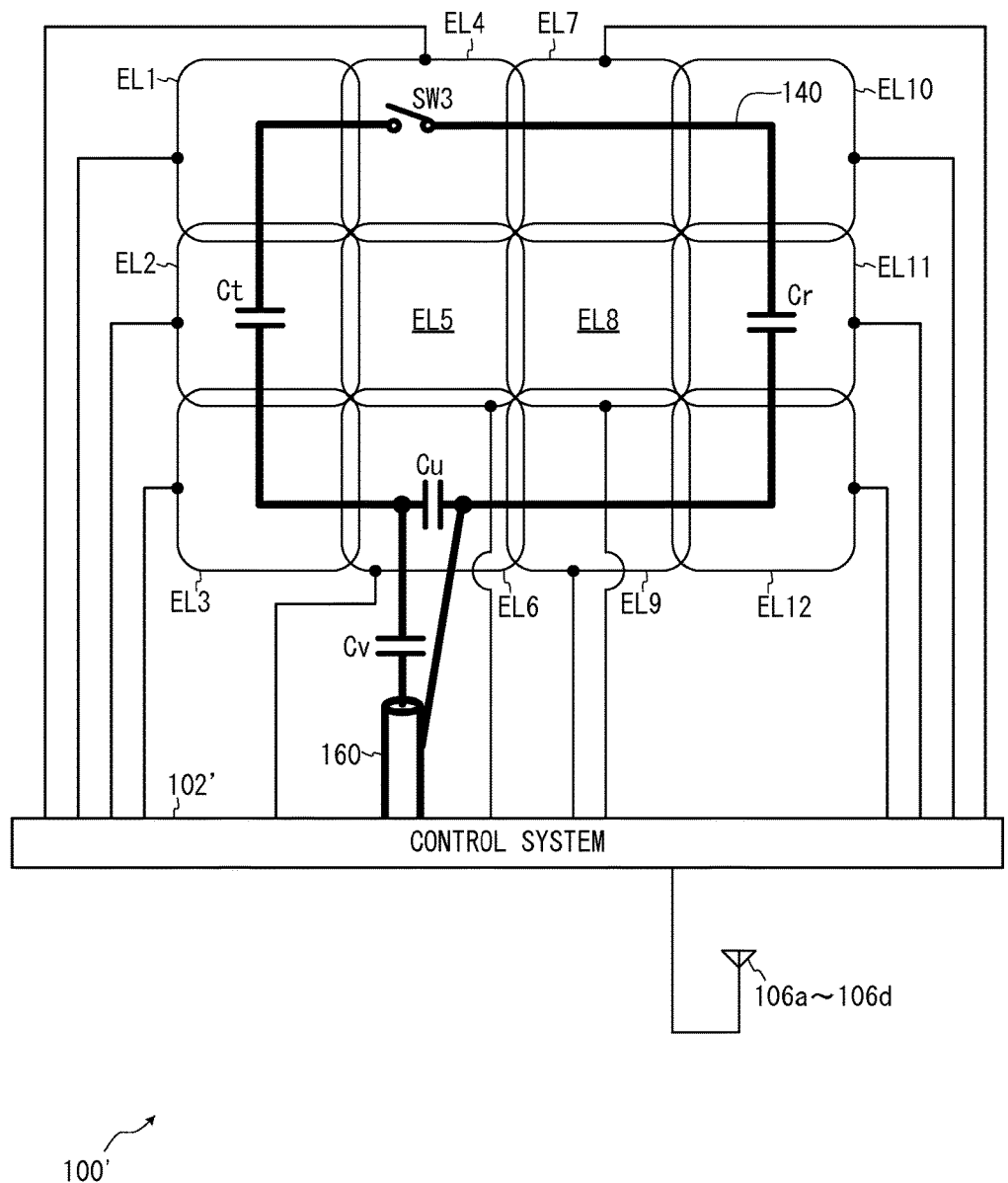
FIG. 22 is a schematic equivalent circuit diagram showing an example of the structure of the RF coil device of the fourth embodiment.

FIG. 22 is a schematic equivalent circuit diagram showing an example of the structure of the RF coil device 100' of the fourth embodiment. Although twelve coil elements EL1 to EL12 are shown in FIG. 22 in order to avoid complication, the number of the coil elements may be thirteen, more than thirteen, eleven of less than eleven.

In FIG. 22, only the wires of the power receiving coil 140 and the wires of the coaxial cable 160 connected to the power receiving coil 140 are indicated by bold lines in order to distinguish them from the wires of the coil elements EL1 to EL12.

The power receiving coil 140 includes a switch SW3 and capacitors Cr, Ct and Cu. The circuit constants of the power receiving coil 140 such as the respective capacitance values of the capacitors Cr, Ct and Cu are selected, in such a manner that the resonance frequency of the power receiving coil 140 becomes the frequency for power transmission (the second resonance frequency f2 of the first embodiment).

Although electric power can be wirelessly transmitted so as to avoid predetermined periods like FIG. 9 to FIG. 11 by the output control of the power transmitter 49, electric power can be received so as to avoid predetermined periods by ON/OFF switching of the switch SW3.

In addition, one end side of the coaxial cable 160 is respectively connected to both ends of the capacitor Cu of the power receiving coil 140. The other end side of the coaxial cable 160 is connected to the control system 102' of the RF coil device 100'. The capacitor Cv is inserted in the one end side of the coaxial cable 160.

The respective capacitance values of the capacitor Cu of the power receiving coil 140 and the capacitor Cv inserted in the coaxial cable 160 are selected in such a manner that they function as an impedance matching circuit.

Because the general structure of each of the coil elements EL1 to EL12 may be the same as coil elements of the conventional technology, detailed explanation is omitted. However, for the sake of obtaining the decoupling effect, the respective coil elements EL1 to EL12 are arranged in such a manner that the plane including wires of the power receiving coil 140 becomes in parallel with the plane including the wires of the respective coil elements EL1 to EL12. In addition, each of the coil elements EL1 to EL12 is arranged so as to partially overlap each other when they are viewed from above in order for them to have mutual decoupling effect.

Figure 23:
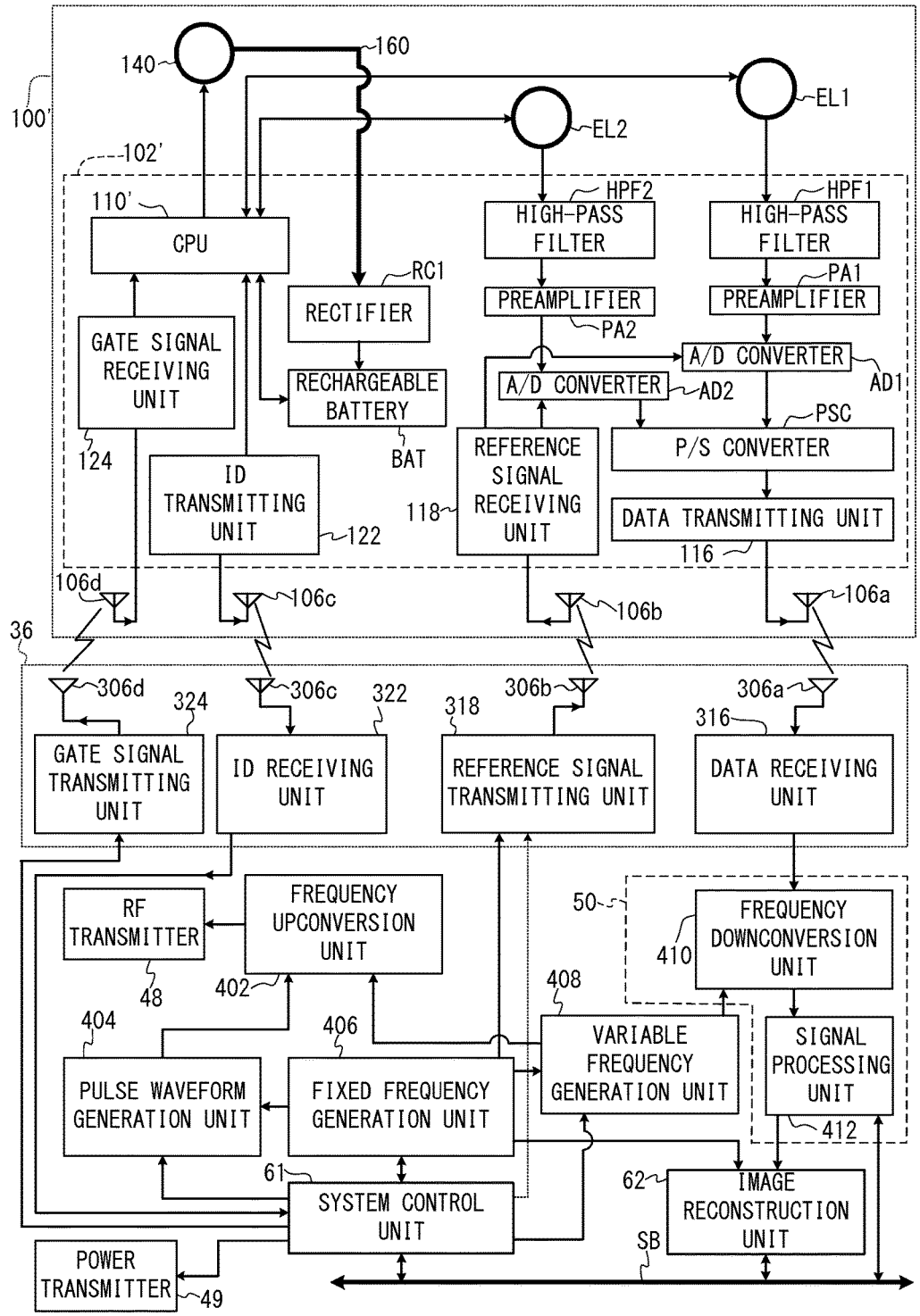
FIG. 23 is a schematic block diagram showing the respective components relevant to the digital radio communication system of the MR signals and the charging system, in the MRI apparatus of the fourth embodiment.

FIG. 23 is a schematic block diagram showing the respective components relevant to the digital radio communication system of the MR signals and the charging system, in the MRI apparatus 10 of the fourth embodiment.

The control system 102' of the RF coil device 100' includes the high pass filters HPF1 to HPF12, the preamplifiers PA1 to PA12 and the A/D convertors AD1 to AD12, all of which respectively correspond to the coil elements EL1 to EL12.

However, only the connection destinations of the coil elements EL1 and EL2 are shown in FIG. 23, because illustrating hard-wiring of all the coil elements makes FIG. 23 complicated. Actually, there are the high pass filters HPF3 to HPF12, the preamplifiers PA3 to PA12 and the A/D convertors AD3 to AD12, to which MR signals of the coil elements EL3 to EL12 are respectively inputted in the pathway similar to that of the coil element EL1. However, they are not illustrated.

In addition, the control system 102' further includes a CPU 110', a rectifier RC1, the rechargeable battery BAT, the P/S convertor PSC, the data transmitting unit 116, the reference signal receiving unit 118, the ID transmitting unit 122 and the gate signal receiving unit 124. In addition, the RF coil device 100' includes the antennas 106a to 106d, similarly to the first embodiment.

Each of the coil elements EL1 to EL12 detects the MR signals emitted from the object P, and these MR signals are inputted to the preamplifiers PA1 to PA12 via the high pass filters HPF1 to HPF12.

The high pass filters HPF1 to HPF12 remove noise such as the frequency component of the wirelessly transmitted alternating-current power.

Each of the MR signals inputted to the preamplifiers PA1 to PA12 is wirelessly transmitted to the radio communication device 36 and subjected to the processing, in the same way as the first embodiment.

On the other hand, the electromagnetic waves of the second resonance frequency f2 are emitted from the whole body coil WB1 by the electric power supplied from the power transmitter 49.

The power receiving coil 140 of the RF coil device 100' wirelessly receives the alternating-current power by resonating at this second resonance frequency f2. The alternating-current power received by the power receiving coil 140 is taken in the control system 102' via the coaxial cable 160, and is converted into direct-current electricity by the rectifiers RC1. The rectifiers RC1 charges the rechargeable battery BAT by this direct-current electricity.

As just described, in the fourth embodiment, the coil elements EL1 to EL12 exclusively for detecting MR signals and the power receiving coil 140 exclusively for receiving electric power are disposed in the RF coil device 100' side. Although the coil arrangement on the RF coil device 100' is different from the first embodiment, the same effects as the first embodiment are obtained in the fourth embodiment.

As compared with the first embodiment, though the power receiving coil 140 is separately provided, the number of the rectifiers can be reduced to one and the duplexers can be omitted in the RF coil device 100'.

Note that, though the power receiving coil 140 is a loop type in the fourth embodiment, this is only an example. The power receiving coil in the RF coil device 100' may be eight-letter shaped, for example.

The Fifth Embodiment

The structure of the MRI apparatus 10 of the fifth embodiment is the same as the fourth embodiment, except that a coil exclusively for power transmission is separately provided in the power transmission side like the second embodiment or the third embodiment.

Thus, instead of the whole body coil WB1 of the double resonance system in the first embodiment and the fourth embodiment, (1) the whole body coil WB2 and (2) one of the power transmitting coil PT1 (see FIG. 13 to FIG. 16) and the power transmitting coil unit PT2 (see FIG. 20 and FIG. 21) are disposed inside the gantry 30.

That is, the fifth embodiment can be interpreted as combination of the first to the fourth embodiments, and a structure chart for each component of the MRI apparatus 10 of the fifth embodiment is omitted.

Here, as to wireless power transmission, transmission efficiency can be improved in a condition in which the power transmitting coil (PT1 or PT2) easily couples to the power receiving coil. In order to achieve this, it is considered to be preferable if the directions of the magnetic fluxes that respectively pass through both sides are the same.

Figure 24:
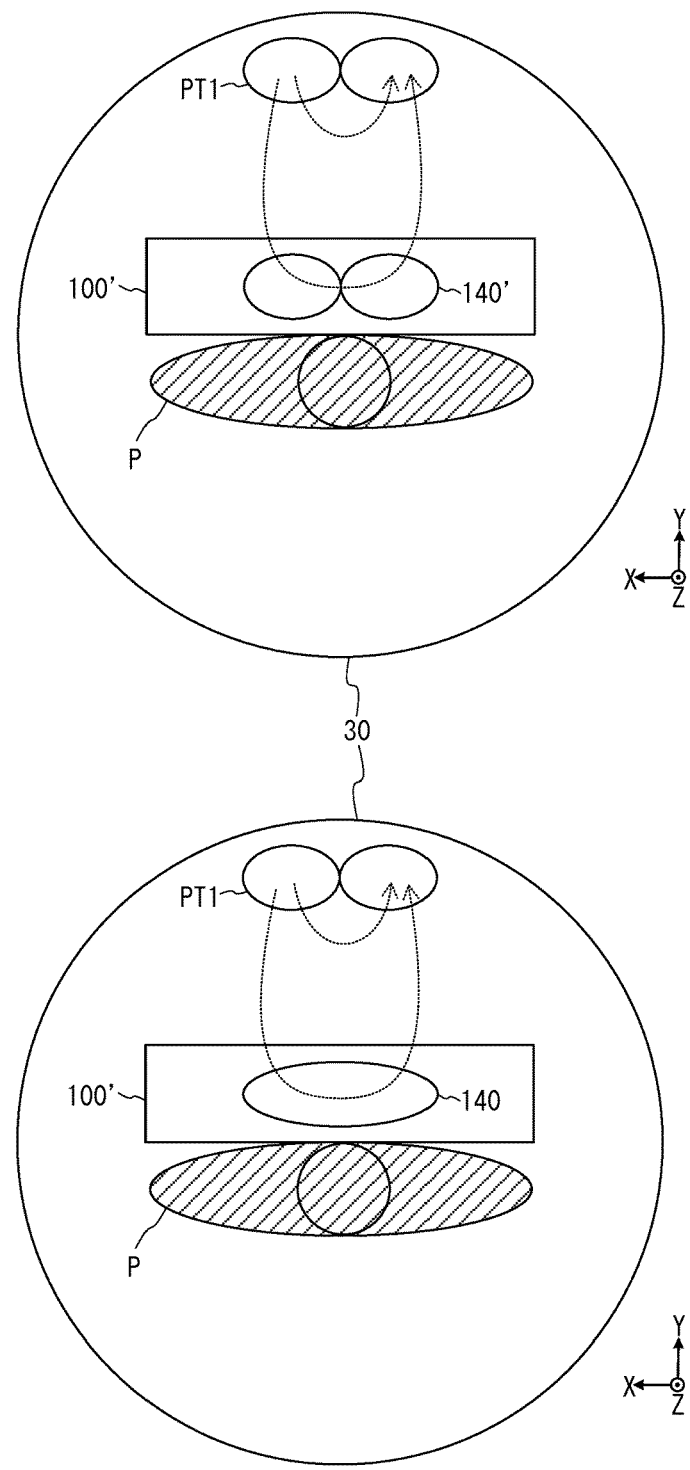
FIG. 24 is an explanatory diagram showing a difference in degree of the coupling effect between combinations with the power transmitting coil, in the case of using the eight-letter shaped power transmitting coil in the fifth embodiment.

FIG. 24 is an explanatory diagram showing a difference in degree of the coupling effect between combinations with the power transmitting coil, in the case of using the eight-letter shaped power transmitting coil PT1 in the fifth embodiment.

When the power transmitting coil PT1 of eight-letter shape is disposed to the upper side in the vertical direction (the Y axis direction) inside the gantry 30 like FIG. 18, it is preferable that the power receiving coil of the RF coil device 100' loaded on the object P is the power receiving coil 140' of eight-letter shape (see the upper part of FIG. 24).

This is because the magnetic fluxes generated from the power transmitting coil PT1 pass through the hard-wiring of the power receiving coil 140' in a route that easily generates an induced current, if a power transmitting coil of an eight-letter shape and a power receiving coil of an eight-letter shape are arranged so as to face each other.

More specifically, as shown in the upper part of FIG. 24, the direction of the first magnetic flux passing through the right loop of the power receiving coil 140' of an eight-letter shape and the direction of the second magnetic flux passing through its left loop are opposite to each other in a plane where the hardwiring of the power receiving coil 140' extends. Accordingly, the direction of the electric current induced in the right loop by the first magnetic flux and the direction of the electric current induced in the left loop by the second magnetic flux are the same in terms of circuit, because the right loop and the left loop are wired so as to become the eight-letter shape.

On the other hand, consider a case where the power transmitting coil PT1 of eight-letter shape is disposed to the upper side in the vertical direction inside the gantry 30 like FIG. 18 and the power receiving coil 140 of a loop type is arranged on the object P (see the lower part of FIG. 24). In this case, as compared with the upper part of FIG. 24, it is hard to say that the magnetic fluxes generated from the power transmitting coil PT1 pass through the hard-wiring of the power receiving coil 140 in a route that easily cause an induced current. The reason is as follows.

That is, the direction of the first magnetic flux passing through the right side of the loop wire of the power receiving coil 140 and the direction of the second magnetic flux passing through the left side the loop wire are opposite to each other. Accordingly, the direction of the electric current induced by the first magnetic flux and the direction of the electric current induced by the second magnetic flux become opposite to each other.

Figure 25:
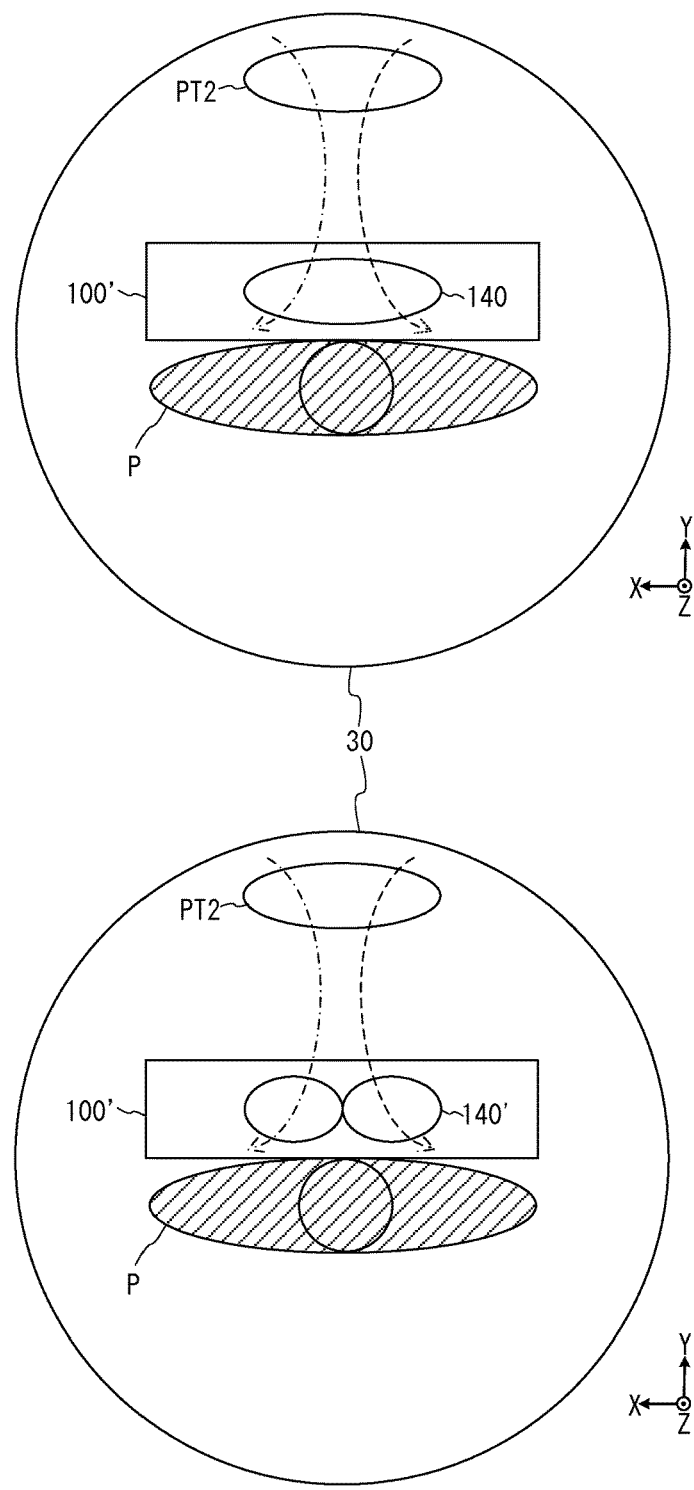
FIG. 25 is an explanatory diagram showing a difference in degree of the coupling effect between combinations with the power transmitting coil, in the case of using the loop type power transmitting coil in the fifth embodiment.

FIG. 25 is an explanatory diagram showing a difference in degree of the coupling effect between combinations with the power transmitting coil, in the case of using the loop type power transmitting coil PT2 in the fifth embodiment.

It is preferable that the power receiving coil of the RF coil device 100' loaded on the object P is the power receiving coil 140 of a loop type, if the power transmitting coil unit PT2 of a loop type is disposed to the upper side in the vertical direction inside the gantry 30 (see the upper part of FIG. 25).

This is because the magnetic fluxes generated from the power transmitting coil PT2 pass through the hard-wiring of the power receiving coil 140 in a route that easily generates an induced current, if a power transmitting coil of a loop type and a power receiving coil of a loop type are arranged so as to face each other. The reason is as follows.

For example, in the upper part of FIG. 25, the direction of the first magnetic flux (indicated by a dashed line) passing through the right side of the loop wire of the power receiving coil 140 and the direction of the second magnetic flux (indicated by a chain line) passing through the left side of the loop wire are the same, when they are viewed from a plane where the wire of the power receiving coil 140 extends. Accordingly, the direction of the electric current induced by the first magnetic flux becomes the same as the direction of the electric current induced by the second magnetic flux.

On the other hand, consider a case where the power transmitting coil unit PT2 of a loop type is disposed to the upper side in the vertical direction inside the gantry 30 and the power receiving coil 140' of an eight-letter shape is loaded on the object P (see the lower part of FIG. 25). In this case, as compared with the upper part of FIG. 25, it is hard to say that the magnetic fluxes generated from the power transmitting coil PT2 pass through the hard-wiring of the power receiving coil 140' in a route that easily causes an induced current.

This is because the power receiving coil 140' is wired into an eight-letter shape, and thus the direction of the electric current induced in the right side of the power receiving coil 140' by the right side magnetic flux indicated by a dashed line becomes opposite to the direction of the electric current induced in the left side by the left side magnetic flux indicated by a chain line in terms of circuit in the lower part of FIG. 25.

Thus, in the fifth embodiment, the power transmitting coil and the power receiving coil are selected so as to accord with the combination of the upper part of FIG. 24 or the upper part of FIG. 25.

As just described, the same effects as the first embodiment are obtained in the fifth embodiment.

According to each of the aforementioned embodiments, electric power of an RF coil device can be saved satisfactorily and effectively in structure of wirelessly transmitting MR signals detected by the RF coil device to a control side of an MRI apparatus.

(Supplementary Notes on the Embodiments)

[1] In the first to fifth embodiments, examples in which only one wearable type RF coil device is used have been explained. However, embodiments of the present invention are not limited to such aspects.

In a case where a plurality of wearable type RF coil devices are used, electric power can be wirelessly transmitted to each of the RF coil devices by the magnetically coupled resonant type wireless power transfer and digitized MR signals from each of the RF coil devices can be wirelessly received by the radio communication device 36 on the basis of the aforementioned theory.

When a plurality of wearable type RF coil devices are used, electric power may be wirelessly transmitted to at least one of the RF coil devices by the magnetically coupled resonant type wireless power transfer in the above manner, and as to the rest of the RF coil devices, conventional type of RF coil devices each of which is connected to a connection port of an MRI apparatus by wire may be used.

[2] Examples in which the radio communication device 36 is disposed to the deep side of the gantry 30 in FIG. 1 have been explained. However, embodiments of the present invention are not limited to such an aspect.

The radio communication device 36 may be disposed to another position such as the entrance of the gantry 30, for example.

In addition, when a plurality of RF coil devices are used, a plurality of the radio communication devices 36 respectively corresponding to the plurality of RF coil devices may be provided, for example.

[3] Correspondences between terms used in the claims and terms used in the embodiments described above will be described. Note that the correspondences described below are just some of possible interpretations for reference and should not be construed as limiting the present invention.

In the first embodiment and the fourth embodiment, the power transmitter 49 and the whole body coil WB1 are examples of the power transmitting unit described in the claims.

In the second embodiment, the third embodiment and the fifth embodiment, the power transmitter 49 and the power transmitting coil PT1 (or PT2) are examples of the power transmitting unit described in the claims.

In the first embodiment, the second embodiment and the third embodiment, the coil elements EC1 to EC4, the capacitor C3, the coaxial cables 104 and the duplexers DP1 to DP4 are examples of the power receiving unit described in the claims.

In the fourth embodiment, the power receiving coil 140 and the coaxial cables 160 are examples of the power receiving unit described in the claims.

The radio communication device 36 is an example of the signal receiving unit described in the claims.

The A/D convertors AD1 to AD4 (or AD1 to AD12), the P/S convertor PSC, the data transmitting unit 116 and the antenna 106a in the RF coil devices 100 and 100' are examples of the signal transmitting unit described in the claims.

The rechargeable battery BAT is an example of the charge/discharge element described in the claims.

[4] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus configured to receive a nuclear magnetic resonance (NMR) signal from an RF coil that detects an NMR signal emitted from an object, the magnetic resonance imaging apparatus comprising:
    a double resonance whole body (WB) coil configured as a birdcage coil and to wirelessly transmit an alternating current power to an magnetic resonance imaging (MRI) RF coil that detects a nuclear magnetic resonance (NMR) signal emitted from an object, the double resonance WB coil comprising:
    a circular loop conductor; and
    a linear connecting conductor,
    wherein the double resonance WB coil is configured to resonate at an NMR frequency and at a lower alternating current power supply frequency, wirelessly transmit electric power to a power receiving circuit of the RF coil at the power supply frequency, and to also induce the object to emit NMR signals by transmitting RF NMR excitation signals into said object, and
    an RF NMR signal having the NMR frequency is connected to one of the circular loop conductor and the linear connecting conductor, and an alternating current power signal having said power supply frequency is connected to the other of the circular loop conductor and the linear connecting conductor.

2. The magnetic resonance imaging apparatus according to claim 1, wherein the RF coil includes (A) a power receiving coil element configured to receive wirelessly transmitted electric power and (B) a coil element configured to detect NMR signals from the object.

3. The magnetic resonance imaging apparatus according to claim 1, wherein the MRI apparatus is configured to wirelessly transmit electric power to the RF coil continuously, including a period during which an RF NMR excitation pulse is transmitted to an imaging region and a period during which thus induced NMR signals are detected by the RF coil.

4. The magnetic resonance imaging apparatus according to claim 1,
wherein the power transmitting unit is configured to wirelessly transmit electric power to the RF coil device, avoiding a period during which an RF NMR excitation pulse is transmitted from the magnetic resonance imaging apparatus to an imaging region.

5. The magnetic resonance imaging apparatus according to claim 1, wherein the NMR apparatus is configured to wirelessly transmit electric power to the RF coil, avoiding a period during which NMR signals are detected by the RF coil.

6. The magnetic resonance imaging apparatus according to claim 1, wherein the MRI apparatus is configured to wirelessly transmit electric power to the RF coil, avoiding (A) a period during which an RF NMR excitation pulse is transmitted to an imaging region and (B) a period during which NMR signals are detected by the RF coil.

7. A double resonance whole body (WB) coil configured as a birdcage coil and to wirelessly transmit an alternating current power to an magnetic resonance imaging (MRI) RF coil that detects a nuclear magnetic resonance (NMR) signal emitted from an object, the double resonance WB coil comprising:
a circular loop conductor; and
a linear connecting conductor,
wherein the double resonance WB coil is configured to resonate at an NMR frequency and at a lower alternating current power supply frequency, wirelessly transmit electric power to a power receiving circuit of the RF coil at the power supply frequency, and to also induce the object to emit NMR signals by transmitting RF NMR excitation signals into said object, and
an RF NMR signal having the NMR frequency is connected to one of the circular loop conductor and the linear connecting conductor, and an alternating current power signal having said power supply frequency is connected to the other of the circular loop conductor and the linear connecting conductor.

* * * * *